(12) United States Patent
Takahashi et al.

(10) Patent No.: US 6,538,719 B1
(45) Date of Patent: Mar. 25, 2003

(54) EXPOSURE APPARATUS AND EXPOSURE METHOD, AND DEVICE AND METHOD FOR PRODUCING THE SAME

(75) Inventors: Masato Takahashi, Kumagaya (JP); Nobukazu Ito, Matudo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/786,238
(22) PCT Filed: Sep. 2, 1999
(86) PCT No.: PCT/JP99/04757
§ 371 (c)(1), (2), (4) Date: Mar. 2, 2001
(87) PCT Pub. No.: WO00/14779
PCT Pub. Date: Mar. 16, 2000

(30) Foreign Application Priority Data

Sep. 3, 1998 (JP) .............................. 10-248938

(51) Int. Cl.⁷ ...................... G03B 27/42; G03B 27/58; G03B 27/62
(52) U.S. Cl. .............. 355/53; 355/72; 355/75
(58) Field of Search ................ 355/53, 67, 72–76, 355/55; 310/10, 12; 318/647–649

(56) References Cited

U.S. PATENT DOCUMENTS

| | | | | |
|---|---|---|---|---|
| 4,952,858 A | | 8/1990 | Galburt | 318/647 |
| 5,909,272 A | * | 6/1999 | Osanai et al. | 355/53 |
| 6,128,069 A | * | 10/2000 | Korenaga | 355/53 |
| 6,177,978 B1 | * | 1/2001 | Korenaga | 355/53 |
| 6,222,614 B1 | * | 4/2001 | Ohtomo | 355/53 |
| 6,285,444 B1 | * | 9/2001 | Osanai et al. | 355/72 |

FOREIGN PATENT DOCUMENTS

| | | |
|---|---|---|
| EP | 0 811 883 | 12/1997 |
| JP | 2-199813 | 8/1990 |
| JP | 8-166043 | 6/1996 |
| JP | 9-148237 | 6/1997 |
| JP | 9-306815 | 11/1997 |
| JP | 11-294520 | 10/1999 |

* cited by examiner

Primary Examiner—Henry Hung Nguyen
(74) Attorney, Agent, or Firm—Oblon, Spivak, McClelland, Maier & Neustadt, P.C.

(57) ABSTRACT

Vibration isolators (56B, 56C) supporting a main column (14) is mounted on a base plate (BP1), and vibration isolators (66B, 66C) supporting a stage supporting bed (16) is mounted independently of the base plate (BP1) on a base plate (BP2) arranged on the floor (FD). Therefore, vibration traveling between the base plates (BP1, BP2) is cut off, and the reaction force produced due to the movement (driving) of a wafer stage (WST) is not the cause of vibration of a projection optical system (PL) supported by the main column (14). Accordingly, a positional shift of the pattern to be transferred or an image blur due to the vibration of the projection optical system (PL) can be effectively avoided, and the exposure accuracy can be improved. Furthermore, it is possible to increase the speed and size of the substrate stage (WST), therefore, the throughput can also be improved.

15 Claims, 9 Drawing Sheets

EXPOSURE APPARATUS AND EXPOSURE METHOD, AND DEVICE AND METHOD FOR PRODUCING THE SAME

TECHNICAL FIELD

The present invention relates to an exposure apparatus and exposure method, and a device and its manufacturing method. More particularly, the present invention relates to an exposure apparatus used to manufacture semiconductor devices and liquid crystal display devices and the like in a lithographic process and the exposure method, and a device manufactured by using the exposure apparatus and its manufacturing method using the exposure method to manufacture the device.

BACKGROUND ART

Conventionally, in a lithographic process which is a process when manufacturing a semiconductor device, various exposure apparatus are used to transfer a circuit pattern formed on a mask or a reticle (hereinafter referred to as a "reticle" in general) onto a substrate such as a wafer or a glass plate and the like that are coated with a resist (photoresist).

For example, with the exposure apparatus for semiconductor devices, the reduction projection exposure apparatus that reduces and transfers the pattern formed on a reticle using a projection optical system is mainly used, so as to comply with the finer minimum line width (device rule) of the pattern required with the higher integration of the integrated circuits.

Of the reduction projection exposure apparatus, the static type exposure apparatus (the so-called stepper) which employs the step-and-repeat method to sequentially transfer the pattern formed on the reticle to a plurality of shot areas on the wafer, or an improvement of the stepper which is the scanning exposure apparatus that employs the step-and-scan method (the so-called scanning stepper) disclosed in, for example, Japanese Patent Laid Open No. 08-166043, which synchronously moves the reticle and the wafer in a one dimensional direction and transfers the reticle pattern onto each shot area on the wafer, are well known.

With these reduction projection exposure apparatus, a base plate which is to be the base of the apparatus, is first of all, arranged on the floor. And on the base plate, the main column which supports the reticle stage, the wafer stage, and the projection optical system (projection lens) and the like, is mounted via the vibration isolator which is arranged to isolate the vibration travelling through the floor. With recent reduction projection exposure apparatus, as the vibration isolator, an active vibration isolator is employed. The active vibration isolator comprises an air mount which the internal pressure is adjustable and a voice coil motor, and the vibration of the main column is suppressed by controlling the voice coil motor and the like based on the measurement values of the six accelerometers attached to the main column (mainframe).

With the steppers, after a shot area on the wafer is exposed, exposure is sequentially repeated onto the remaining shot areas. Therefore, the reaction force due to the acceleration and deceleration of the wafer stage (in the case of the stepper) or the reticle stage and the wafer stage (in the case of the scanning stepper) was the cause of vibration of the main column, which in turn caused an unfavorable situation such as creating a positional relationship error between the projection optical system and the wafer.

The error in the positional relationship on alignment and on exposure has consequently been the cause of the pattern being transferred onto a position on the wafer different from the designed value, or in the case the positional error includes a vibration component, led to an image blur (increase in the pattern line width).

Accordingly, in order to prevent the pattern being transferred from shifting, or to suppress the image blur, the vibration of the main column needed to be sufficiently attenuated, such as by the active vibration isolator described above. For example, in the case of the stepper, alignment operation and exposure operation was to begin after the wafer stage was positioned at the desired place and has sufficiently settled down, whereas in the case of the scanning stepper, the reticle stage and the wafer stage had to be sufficiently settled in synchronous before exposure was performed. Consequently, these were causes of lowering the throughput (productivity).

With the size of the wafer increasing in recent years, the size of the wafer stage has also increased, making it difficult to secure the throughput to some extent and performing precise exposure even by using the active vibration isolator earlier described.

To solve such inconvenience, in the Japanese Patent Laid Open No. 02-199813, an exposure apparatus is proposed, which stage holding the substrate and the projection lens mount holding the projection lens are arranged on separate vibration isolation mounts.

However, to arrange the vibration isolation mount on the floor is difficult, due to the features of the vibration isolation mount. Furthermore, since a member which will be the base of the apparatus is necessary, with the exposure apparatus in the Japanese Patent Laid Open No. 02-199813, a main body mount which supports the main body holding the projection lens and a XY stage mount which supports the XY stage are arranged on the same positioning supporting bed. Therefore, even with the exposure apparatus described in the disclosure above, the vibration caused by the reaction force when the XY stage is driven travels via the XY stage mount to the positioning supporting bed, and the vibration further travels via the main body mount to the projection optical system held by the main body. This makes it obvious that the pattern image shift and the image blur and the like, described earlier, cannot be totally prevented.

Since the device rule will become finer in the future, and the wafer and the reticle larger in size, it is evident that the vibration caused when the stage is driven will become a more serious problem. Accordingly, the requirement of a new technology to be developed is pressing, to effectively suppress the adverse effects of the vibration of each component affecting the exposure accuracy.

The present invention has been made in consideration of the situation described above, and has as its first object to provide an exposure apparatus and exposure method which improves both the exposure accuracy and the throughput.

And the present invention has as its second object to provide a highly integrated device on which a fine pattern is accurately formed, and the device manufacturing method.

DISCLOSURE OF INVENTION

According to the first aspect of the present invention, there is provided a first exposure apparatus which forms a predetermined pattern on a substrate (W) by using an exposing optical system (PL), the exposure apparatus comprising: a main column (14) which supports the exposing optical system; a first vibration isolator (56A to 56C) which supports the main column; a first base member (BP1) which supports the first vibration isolator, mounted on the floor surface (FD); a stage supporting bed (16) which supports a substrate stage (WST) which holds the substrate; a second vibration isolator (66A to 66C) which supports the stage supporting bed; and a second base member (BP2) which supports the second vibration isolator, mounted on the floor surface independently from the first base member.

According to this aspect, the first vibration isolator supporting the main column is arranged on the first base member, and the second vibration isolator supporting the stage supporting bed is arranged on the second base member which is arranged on the floor surface independently from the first base member. Therefore, vibration travelling between the first base member and the second base member is nearly cut off. So, the reaction force caused with the movement (driving) of the substrate stage supported on the stage supporting bed travels to the second vibration isolator and the second base member, but does not travel to the first base member side. Thus, the reaction force caused with the movement (driving) of the substrate stage is not the cause of vibration of the exposing optical system supported by the main column. Accordingly, positional shift or unevenness in uniformity of line width of the pattern formed on the substrate due to the vibration of the exposing optical system can be effectively suppressed, and the substrate stage can have higher speed and larger size, which leads to an improvement in throughput.

In this case, as the vibration isolator, a passive vibration isolator which function is solely to isolate fine vibration from the floor surface may be used. It is, however, preferable to have at least one of the first vibration isolator and the second vibration isolator to be an active vibration isolator, which can positively control the vibration occurring to the main column or the stage supporting bed.

In this description, an active vibration isolator comprises an air mount which internal pressure is controllable, and an actuator such as a voice coil motor. And, it refers to a vibration isolator which has the function of removing vibration of the object subject to vibration control by controlling the voice coil motors and the like, based on the measurement values of the vibration sensors (such as accelerometers) attached to the object subject to vibration control.

With the first exposure apparatus according to the present invention, for example, in the case the first vibration isolator (56A to 56C) is an active vibration isolator, the exposure apparatus may further comprise: a column position measurement unit (98) which measures a positional relationship between the first base member (BP1) and the main column (14); and a controller (50) which controls the first vibration isolator based on a measurement value of the column position measurement unit. In such a case, the controller controls the first vibration isolator based on the positional relationship between the first base member and the main column measured by the column position measurement unit. And the main column, and naturally the exposing optical system supported by the main column, can be maintained at a stable position with the first base member as a datum. In addition, for example, in the case a mask stage which holds the mask is arranged on the main column, the vibration caused in the main column due to the movement of the mask stage can be suppressed or removed by the active vibration isolator supporting the main column.

In addition, with the first exposure apparatus according to the present invention, for example, in the case the second vibration isolator (66A to 66C) is an active vibration isolator, the exposure apparatus may further comprise: a stage supporting bed position measurement unit (94) which measures a positional relationship between the first base member (BP1) and the stage supporting bed (16); and a controller (50) which controls the second vibration isolator based on a measurement value of the stage supporting bed position measurement unit. In such a case, the controller controls the second vibration isolator based on the positional relationship between the first base member and the stage supporting bed measured by the stage supporting bed position measurement unit. Also, the vibration caused in the stage supporting bed due to the movement of the substrate stage can be suppressed or removed by the active vibration isolator.

With the first exposure apparatus according to the present invention, the exposure apparatus may further comprise a supporting member which supports the exposing optical system at three points by a V-groove, a conical groove, and a planar surface in respect to the main column. In such a case, the exposing optical system is supported in what is called a kinematic support via the supporting member in respect to the main column. Therefore, the expansion and contraction force, as well as the moment does not travel between the main column and the exposing optical system. Accordingly, the exposing optical system can easily be assembled into the main column, and furthermore, stress after assembly due to the vibration of the main column and the exposing optical system, change of temperature, and change of posture can be most effectively reduced.

With the first exposure apparatus according to the present invention, in the case the second vibration isolator is an active vibration isolator, the exposure apparatus may further comprise: a three degrees of freedom position measurement unit which optically measures a positional relationship between the exposing optical system and one of the stage supporting bed and the substrate stage in directions of three degrees of freedom, which are directions of an optical axis of the exposing optical system and a tilt direction in respect to a plane perpendicular to the optical axis; and a controller which controls the second vibration isolator based on a measurement value of the three degrees of freedom position measurement unit. In such a case, with the three degrees of freedom position measurement unit, the positional relationship between the exposing optical system and one of the stage supporting bed and the substrate stage is optically measured in directions of three degrees of freedom in the optical axis direction of the exposing optical system and a tilt direction in respect to a plane perpendicular to the optical axis. And the controller controls the second vibration isolator based on the measurement values of the three degrees of freedom position measurement unit. Thus, the positional relationship between the exposing optical system and the substrate stage is adjusted in directions of three degrees of freedom in the optical axis direction of the exposing optical system and a tilt direction in respect to a plane perpendicular to the optical axis. Accordingly, for example, even in the case where it is difficult to detect the position and posture of the surface of the substrate in directions of three degrees of freedom, the positional relationship between the exposing optical system and the substrate stage can be adjusted in directions of three degrees of freedom. That is, focus leveling control is possible, or the focus can be brought to a proximate level for focus leveling control.

In this case, the main column can have a supporting member which supports a barrel of the exposing optical system, and the three degrees of freedom position measurement unit can comprise: an interferometer which can measure the distance between one of the stage supporting bed and the substrate stage, and the supporting member at three different points. In this case, the interferometer may of course, be fixed to the supporting member, however, the interferometer may also be fixed to the barrel of the exposing optical system.

Alternatively, the three degrees of freedom position measurement unit may comprise: an interferometer which measures distance between one of the stage supporting bed and the substrate stage, and the exposing optical system at three different points.

With the first exposure apparatus according to the present invention, in the case the exposure apparatus further comprises a mask holding member (RST) which is supported by the main column (14) and holds a mask (R) on which the predetermined pattern projected on the substrate (W) by the exposing optical system (PL) is formed, at least one of a mask carriage system (110) which loads and unloads the mask in respect to the mask holding member and a substrate carriage system (112) which loads and unloads the substrate in respect to the substrate stage (WST) is arranged on the first base member (BP1), and the exposure apparatus can further comprise: a position measurement system (98) which measures a positional relationship between the first base member and the main column; an interferometer system (46, 90X, 90Y) which measures a position of at least one of the mask holding member and the substrate stage with one of the exposing optical system and a part of the main column as a datum; and a controller (50) which controls the carriage system arranged on the first base member based on a measurement value of the position measurement system and the interferometer system. With this arrangement, for example in the case the interferometer system measures the position of the mask holding member with the exposing optical system (or a part of the main column) as a datum, the controller can for example, control the mask carriage system based on the measurement values of the interferometer system and the position measurement system when the mask is exchanged. By doing so, the position of the mask holding member which datum is the first base member during carriage, can be fixed at all times, and as a consequence, the mask can be loaded on the mask holding member at the desired position.

In addition, in the case the interferometer system measures the position of the substrate stage with the exposing optical system (or a part of the main column) as a datum, the controller can for example, control the substrate carriage system based on the measurement values of the interferometer system and the position measurement system when the substrate is exchanged. By doing so, the position of the substrate stage which datum is the first base member can be fixed at all times, and as a consequence, the substrate can be loaded onto the substrate stage at the desired position.

With the first exposure apparatus according to the present invention, in the case the exposure apparatus further comprises an illumination optical system (ILU) which illuminates the mask, the illumination optical system may be arranged on a third base member (BP3) which is arranged on the floor surface independently from the first base member and the second base member. In such a case, vibration can be kept from travelling between the objects respectively arranged on the first, second, and third base member.

With the first exposure apparatus according to the present invention, the first vibration isolator (56A to 56C) may be an active vibration isolator, and the exposure apparatus may further comprise: a mask holding member (RST) which holds a mask (R) on which the predetermined pattern is formed, and finely drives the mask on a surface of the mask above the main column (14) in directions of three degrees of freedom; an illumination optical system (ILU) which illuminates the mask; an active vibration isolator (116) which supports the illumination optical system; a six degrees of freedom position measurement unit (120) which measures a positional relationship between the illumination optical system and the main column in directions of six degrees of freedom; a controller (50) which controls the mask holding member and one of the first vibration isolator and the active vibration isolator holding the illumination optical system, based on a measurement value of the six degrees of freedom position measurement unit. In such a case, the controller adjusts the mask via the mask holding member within the surface in directions of three degrees of freedom based on the positional relationship between illumination optical system and the main column obtained based on the measurement values of the six degrees of freedom position measurement unit. The controller also controls the active vibration isolator holding the first vibration isolator or the illumination optical system, and can adjust the positional relationship between the illumination optical system and the mask in directions of six degrees of freedom.

With the first exposure apparatus according to the present invention, the mask may be movable in a predetermined direction with predetermined strokes within a surface which is perpendicular to an optical axis of the exposing optical system, and the exposure apparatus may further comprise a driver (44, 50, 72) which synchronously drives the mask and the substrate stage in the predetermined direction. In such a case, the driver drives the mask and substrate stage in synchronous within a plane perpendicular to the optical axis of the exposing optical system, and by what is called scanning exposure, the pattern of the mask is accurately transferred onto the substrate with the exposing optical system.

According to the second aspect of the present invention, there is provided a second exposure apparatus which forms a predetermined pattern on a substrate by using an exposing optical system, the exposure apparatus comprising: a main column which supports the exposing optical system; a substrate stage which holds the substrate and is supported independently from the main column; a focus detector (121a, 121b) which detects a position of a surface of the substrate in at least a direction of an optical axis of the exposing optical system; a substrate driving system (88) which drives the substrate in the direction of the optical axis of the exposing optical system; a position measurement system (94, 98, 102) which is arranged independently from the focus detector, and measures a positional relationship between the exposing optical system and the substrate stage; a driver (70) which changes the positional relationship between the exposing optical system and the substrate stage; and a controller (50) which is connected to the focus detector, the substrate driving system, the position measurement system, and the driver, wherein the controller controls the driver and sets the exposing optical system and the substrate stage in a predetermined relationship based on a value measured by the position measurement system, and adjusts a positional relationship between an image plane of the exposing optical system and the substrate via the substrate driving system based on a detection result of the focus detector.

In the case the main column supporting the exposing optical system and the substrate stage holding the substrate is supported individually, although there is an advantage of vibration being difficult to travel between the main column and the substrate stage, there is a risk of the two making individual movements. This may cause a response delay (time delay) in the focus control of the substrate during exposure or the focus leveling control.

However, according to the present invention, on exposure, the controller controls the driver based on the values measured by the position measurement system, in other words, the measurement result of the positional relationship between the exposing optical system and the substrate stage, and the positional relationship between the exposing optical system and the substrate stage is set at a predetermined relationship. Also, the controller adjusts the positional relationship between the image plane of the exposing optical system and the substrate via the substrate driver, based on the detection results of the focus detector. That is, the positional relationship between the exposing optical system and the substrate stage is set at a predetermined relationship, before the controller starts the focus control or focus leveling control on the substrate based on the detection results of the focus detector. Therefore, this can prevent the response delay from occurring when focus control or focus leveling control is performed on the substrate, resulting in a more precise focus control or focus leveling control, allowing improvement in exposure control. In this case, again, with the same reasons as of the first exposure apparatus described earlier, the substrate stage can have higher speed and larger size, which allows an improvement in throughput.

The predetermined relationship, referred to above, is a positional relationship, for example, when considering the responsiveness of the substrate driving system, the surface of the substrate is positioned within a range where preexposing dynamic focusing can be sufficiently performed and no delay occurs in the focus control. That is, a positional relationship where the surface of the substrate is positioned in the vicinity of the focal position of the exposing optical system and can be detected at all times with the focus detector.

The substrate driving system, may be arranged on the substrate stage and a system which drives the substrate in at least the optical axis direction of the exposing optical system. Or, it may be a system which drives the substrate in at least the optical axis direction of the exposing optical system via the substrate stage.

Furthermore, with the present invention, since the focus control or focus leveling control on the substrate can be performed based on the detection results of the position measurement system, in the case of performing exposure on a dummy shot where detection by the focus detector is difficult or when performing exposure on an inward shot and an edge shot, focus control or focus leveling control on the substrate becomes possible. And as a consequence, allows improvement in controllability of the line width.

With the second exposure apparatus according to the present invention, the position measurement system may measure the positional relationship in directions of three degrees of freedom, in an optical axis direction of the exposing optical system and a tilt direction in respect to a plane perpendicular to the optical axis.

In this case, the position measurement system may be fixed to the main column supporting the exposing optical system, or, the position measurement system may be fixed to the barrel of the exposing optical system.

With the second exposure apparatus according to the present invention, in the case the exposure apparatus further comprises a stage supporting member which supports the substrate stage, the position measurement system can measure a positional relationship between the exposing optical system and the stage supporting member in an optical axis direction of the exposing optical system. In such a case, the position measurement system measures the positional relationship between the exposing optical system and the stage supporting member in the optical axis direction of the exposing optical system. Therefore, consequently, this means that the positional relationship between the exposing optical system and the substrate stage supported by the stage supporting member is measured in the optical axis direction of the exposing optical system.

In this case, three measurement points may be arranged on the stage supporting member to measure the positional relationship, and the position measurement system may measure the distance between the exposing optical system and the stage supporting member at the three measurement points. In such a case, based on the measurement results of the distance at the three points, the positional relationship between the exposing optical system and the stage supporting member, in other words, the positional relationship between the exposing optical system and the substrate stage can be obtained in directions of three degrees of freedom in the optical axis direction of the exposing optical system and a tilt direction in respect to a plane perpendicular to the optical axis.

With the second exposure apparatus according to the present invention, the exposure apparatus may further comprise a base member (BP1) which supports the main column, and the position measurement system may have a first position measurement unit (98) which measures a positional relationship between the base member and the exposing optical system, and a second position measurement unit (94) which measures a positional relationship between the base member and the stage supporting member. In such a case, the first position measurement unit measures the positional relationship between the base member and the exposing optical system, and the second position measurement unit measures the positional relationship between the base member and the stage supporting member. Therefore, based on the measurement results of the first position measurement unit and the second position measurement unit, the positional relationship between the exposing optical system and the stage supporting member, in other words, the positional relationship between the exposing optical system and the substrate stage can be obtained.

In this case, at least one of the first position measurement system and the second position measurement system may obtain a relative position in directions of six degrees of freedom as the positional relationship.

According to the third aspect of the present invention, there is provided an exposure method to form a predetermined pattern, by using an exposing optical system, on a substrate on a substrate stage, which is supported independently from a main column supporting the exposing optical system, the exposure method comprising: a first step of measuring a positional relationship between the exposing optical system and the substrate stage; a second step of setting the positional relationship between the exposing optical system and the substrate stage to a predetermined state, based on values measured in the first step; and a third step of forming the pattern onto the substrate in a state of the predetermined state set in the second step, while adjusting a positional relationship between an image plane of the exposing optical system and a surface of the substrate based on a detection result of a position of the surface of the substrate in at least an optical axis direction of the exposing optical system.

As is described earlier, in the case the main column supporting the exposing optical system and the substrate stage holding the substrate is supported individually, although there is an advantage of vibration being difficult to travel between the main column and the substrate stage, there is a risk of the two making individual movements. This may cause a response delay (time delay) in the focus control of the substrate during exposure or the focus leveling control.

However, with the present invention, in the first step the positional relationship between the exposing optical system and the substrate stage is measured, and in the second step, based on the values measured, that is, the measurement result of the positional relationship between the exposing optical system and the substrate stage, the positional relationship between the exposing optical system and the substrate stage is set at a predetermined state. And in the third step, with the positional relationship set at the predetermined state, the relative position between the image plane of the exposing optical system and the surface of the substrate is adjusted based on the detection result of the position of the substrate surface at least in the optical axis direction of the exposing optical system, and the pattern is formed on the substrate.

Accordingly, in the second step, the positional relationship between the exposing optical system and the substrate stage is set at a predetermined relationship based on the measurement results in the first step, before the controller starts the focus control or focus leveling control on the substrate based on the detection results of the focus detector in the third step. Therefore, this can prevent the response delay from occurring when focus control or focus leveling control is performed on the substrate, resulting in a more precise focus control or focus leveling control, allowing improvement in exposure control.

The predetermined relationship, referred to above, is a positional relationship, for example, when considering the responsiveness of the substrate driving system, the surface of the substrate is positioned within a range where pre-exposing dynamic focusing can be sufficiently performed and no delay occurs in the focus control. That is, a positional relationship where the surface of the substrate is positioned in the vicinity of the focal position of the exposing optical system and can be detected at all times with the focus detector. In this case, again, with the same reasons previously, the substrate stage can have higher speed and larger size, which allows an improvement in throughput.

In this case, in the first step, the positional relationship may be measured in directions of three degrees of freedom, in an optical axis direction of the exposing optical system and a tilt direction in respect to a plane perpendicular to the optical axis.

With the exposure method according to the present invention, in the first step, the measurement may be performed by using a position measurement system fixed to the main column supporting the exposing optical system. Or, in the first step, measuring the positional relationship may be performed by using a position measurement system fixed to the barrel of the exposing optical system.

With the exposure method according to the present invention, in the case the substrate stage is supported by a stage supporting member, in the first step, a positional relationship between the exposing optical system and the stage supporting member may be measured in an optical axis direction of the optical system. In such a case, in the first step, the positional relationship between the exposing optical system and the stage supporting member is measured in the optical axis direction of the exposing optical system. And as a consequence, this means that the positional relationship between the exposing optical system and the substrate stage which is supported by the stage supporting member is measured in the optical axis direction of the exposing optical system.

In this case, in the first step, distance between the exposing optical system and the stage supporting member may be measured at three different measurement points arranged on the stage supporting member. In such a case, based on the measurement results of the distance at the three points, the positional relationship between the exposing optical system and the stage supporting member, in other words, the positional relationship between the exposing optical system and the substrate stage can be obtained in directions of three degrees of freedom in the optical axis direction of the exposing optical system and a tilt direction in respect to a plane perpendicular to the optical axis.

With the exposure method according to the present invention, in the case the main column is supported by a base member, the first step can include a first measurement step of measuring a positional relationship between the base member and the exposing optical system, and a second measurement step of measuring a positional relationship between the base member and the stage supporting member. In such a case, in the first measurement step, the positional relationship between the base member and the exposing optical system is measured, and in the second measurement step, the positional relationship between the base member and the stage supporting member is measured. And as a consequence, based on the measurement results of the first measurement step and the second measurement step, the positional relationship between the exposing optical system and the stage supporting member, in other words, the positional relationship between the exposing optical system and the substrate stage can be obtained.

In this case, in at least one of the first measurement step and the second measurement step, a relative position in directions of six degrees of freedom may be obtained as the positional relationship.

In addition, in a lithographic process, by using the exposure method according to the present invention, a multiple layer of patterns can be formed on a substrate with high overlay accuracy, allowing microdevices with higher integration to be produced with high yield, improving its productivity. Likewise, in the lithographic process, by using the exposure apparatus according to the present invention, a multiple layer of patterns can be formed on the substrate with high overlay accuracy. Accordingly, this allows microdevices with higher integration to be produced with high yield, which leads to an improvement in productivity. Therefore, from another aspect of the present invention, there is provided a device manufacturing method that uses the exposure apparatus of the present invention, and a device manufactured by the device manufacturing method.

BEST MODE FOR CARRYING OUT THE INVENTION

Figure 1:
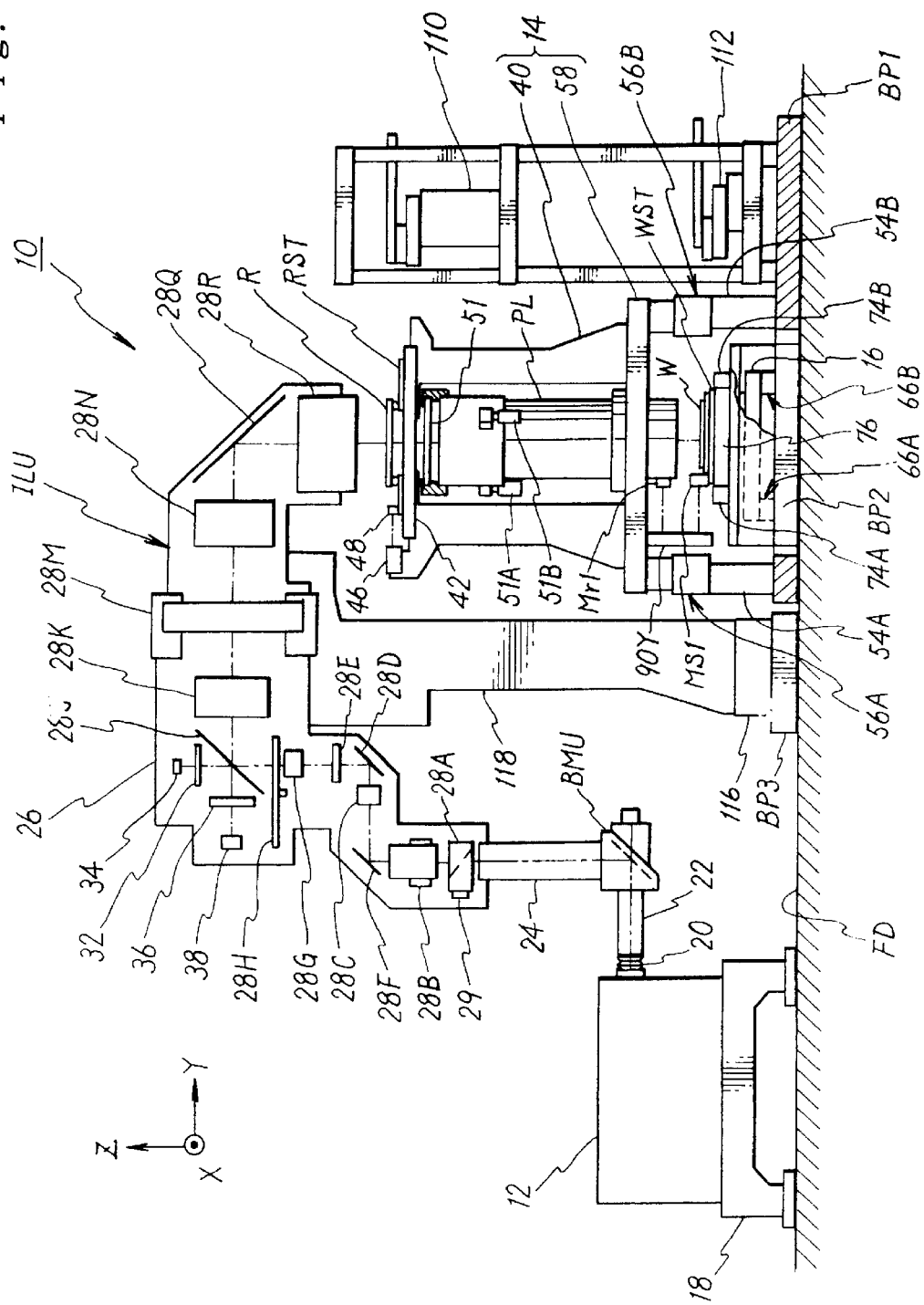
FIG. 1 is schematic view showing the configuration of the exposure apparatus of the embodiment in the present invention.

An embodiment of the present invention will be described below with reference to FIGS. 1 to 7. FIG. 1 shows the schematic arrangement of an exposure apparatus 10 according to the embodiment. The exposure apparatus 10 is a scanning exposure apparatus based on the step-and-scan method, that is the so-called scanning stepper, which synchronously moves the reticle R as a mask and the wafer W as the substrate in a one dimensional direction (in this case, the Y-axis direction) and transfers the circuit pattern formed on the reticle R onto each shot area on the wafer W via the projection optical system PL.

The exposure apparatus 10 comprises: a light source 12; an illumination unit ILU serving as an illumination optical system which illuminates the reticle R with the illumination light from the light source 12; a reticle stage RST serving as a mask holding member which holds the reticle R; a projection optical system PL serving as an exposing optical system which projects the illumination light (ultraviolet pulse light) outgoing from the reticle R onto the wafer W; a wafer stage WST serving as a substrate stage which holds the wafer W; a main column 14 which supports the projection optical system PL and the reticle stage RST; a stage supporting bed 16 which supports the wafer stage WST; a vibration isolation system which suppresses or removes the vibration of the main column 14 and stage supporting bed 16; and the control system which controls each parts.

As the light source 12, an ArF excimer laser light source is used which emits an ArF excimer laser beam narrow-banded between the wavelength of 192–194 nm so as to avoid the absorption range by oxygen. The main portion of the light source 12 is arranged on the floor surface FD in the clean room of a semiconductor manufacturing site via a vibration isolator 18. Along with the light source 12, a light source controller 13 (not shown in FIG. 1, refer to FIG. 3) is arranged. This light source controller 13 controls the oscillation center wavelength and the spectral line width (half-bandwidth) of the pulse ultraviolet beam emitted, the trigger timing of the pulse oscillation, and the gases in the laser chamber, and the like, based on instructions from the main controller 50 (not shown in FIG. 1, refer to FIG. 3) which will be described later.

The light source 12 can be arranged in a separate room (service room) having a lower degree of cleanliness than that of the clean room, or in a utility space provided underneath the floor of the clean room.

The light source 12 is connected to one end (the incident end) of the beam matching unit BMU via a light-shielding bellows 20 and a pipe 22. The other end (the outgoing end) of the beam matching unit BMU is connected to the illumination unit ILU via a pipe 24.

Within the beam matching unit BMU, a plurality of movable reflecting mirrors (omitted in Figs.) are arranged. The main controller 50 uses these movable reflecting mirrors, to perform positional matching of the optical path of the narrowbanded ultraviolet pulse light (ArF excimer laser beam) emitted from the light source 12 and incident via the bellows 20 and the pipe 22 with the illumination unit ILU described below. That is, the incident position or the incident angle of the ultraviolet pulse light into the illumination unit ILU is adjusted to the optimum, so that the light is incident at all times at a predetermined relationship in respect to the optical axis of the illumination unit ILU.

The illumination unit ILU is made up of: a illumination system housing 26 which seals the interior from the outside air; a variable beam attenuator 28A which is housed in a predetermined positional relationship; a beam shaping optical system 28B; a first fly-eye lens system 28C; a vibrating mirror 28D; a condenser lens 28E; a mirror 28F; a second fly-eye lens system 28G; an illumination system aperture stop plate 28H; a beam splitter 28J; a first relay lens 28K; a reticle blind mechanism 28M; a second relay lens 28N; a mirror 28Q; and a main condenser lens system 28R, and the like.

The inside of the illumination system housing 26 is filled with air (oxygen) which concentration does not exceed a few percent, and is preferably filled with clean dry nitrogen gas ($N_2$) or a helium gas (He) having an air (oxygen) concentration less than 1%.

The respective parts referred to above within the illumination system housing 26 will be described next. The variable beam attenuator 28A adjusts the average energy per each pulse ultraviolet beam. For example, a plurality of optical filters that have different beam attenuating ratios being arranged so that they can be switched to change the beam attenuating ratio in sequence can be used. Or the degree of two optical filters overlapping one another which transmittance continuously varies can be adjusted so as to make the beam attenuation ratio continuously variable. The details of an example of such a variable beam attenuator is disclosed in, for example Japanese Patent Laid Open No. 03-179357, and the corresponding U.S. Pat. No. 5,191,374. As long as the national laws in designated states or elected states, to which this international application is applied, permit, the disclosures cited above are fully incorporated herein by reference.

The optical filter structuring the variable beam attenuator 28A is driven by the driving mechanism 29 that includes the motor controlled by the illumination controller 30 (not shown in FIG. 1, refer to FIG. 3), which is under the control of the main controller 50.

The beam shaping optical system 28B shapes the sectional shape of a pulse ultraviolet beam controlled to a predetermined peak intensity by the variable beam attenuator 28A, so that it becomes identical to the general shape of the incident end of the first fly-eye lens system 28C. This improves the incident efficiency of the pulse ultraviolet beam on the first fly-eye lens 28C. The beam shaping optical system 28B is, for example, structured of a cylinder lens or a beam expander (omitted in Figs.) and the like.

The double fly-eye lens system functions to uniform the intensity distribution of the illuminating light. It is configured of the first fly-eye lens system 28C which is sequentially arranged on the optical path of the pulse ultraviolet beam behind the beam forming optical system 28B, the condenser lens system 28E, and the second fly-eye lens system 28G. In this case, between the first fly-eye lens system 28C and the condenser lens system 28E, a vibrating mirror 28D for smoothing interference fringes or tiny speckles caused on the irradiated surface (reticle surface or wafer surface) is arranged. Vibration of the vibrating mirror 28D (deflection angle) is controlled by the illumination controller 30, which is under the control of the main controller 50 via a driving system not shown in Figs.

The details of a similar structure with a combination of a double fly-eye lens system and a vibrating mirror as in this embodiment, is disclosed in, for example, Japanese Patent Laid Open Nos. 01-235289 and 07-142354, and in the corresponding U.S. Pat. Nos. 5,307,207 and 5,534,970. As long as the national laws in designated states or elected states, to which this international application is applied, permit, the disclosures cited above are fully incorporated herein by reference.

An illuminating system aperture stop plate 28H made from a disk-shaped member, is arranged near the emitting surface of the second fly-eye lens system 28G. On this illuminating system aperture stop plate 28H, a plurality of aperture stops are arranged at substantially equal angular intervals. The aperture stops may have an ordinary circular aperture, or it may have a small circular-shaped aperture for reducing the σ-value, which is a coherence factor. It may also have a ring-shaped aperture for ring-shaped illumination, or a plurality of apertures (for example, four apertures) of which each central position differ from the optical axis position for modified illumination. The illuminating system aperture stop plate 28H is rotatably driven by a motor (not shown in Figs.) controlled by the illumination controller 30, and one of the aperture stop is selectively set on the optical path of the ultraviolet pulse light. This limits the illumination shape on the light source side to shapes such as an annular shape, a small circle, a large circle, or quadruple circles in the Koehler illumination, which will be described later.

The beam splitter 28J having a large transmittance and a small reflectance is arranged downstream of the illumination system aperture stop 28H on the optical path of the ultraviolet pulse light. Further downstream of the optical path, the relay optical system made up of the first relay lens 28K and the second relay lens 28N is arranged with the reticle blind mechanism 28M arranged in between.

The reticle blind mechanism 28M in the embodiment is arranged on a surface slightly defocused from the conjugate plane relative to the pattern surface of the reticle R. The reticle blind mechanism 28M includes a fixed reticle blind on which an opening of a predetermined shape is formed so as to set the illumination area on the reticle R. It also includes a movable reticle blind, which is arranged in the vicinity of the fixed reticle blind and has an opening portion which position and width is variable in the direction corresponding to the scanning direction. The opening portion of the fixed reticle blind is formed within the circular field view of the projection optical system PL, and extends linearly in a slit or a rectangular shape in the X-axis direction which is perpendicular to the moving direction of the reticle R (Y-axis direction) during scanning exposure.

In this case, by further limiting the illumination area with the movable reticle blind when starting and completing scanning exposure, exposure of unnecessary portions can be avoided. The movable reticle blind is under the control of the main controller 50 via the driving system (not shown in Figs.).

Further downstream of the second relay lens 78N which structures the relay optical system, on the optical path, the mirror 28Q which reflects the ultraviolet pulse light having passed through the second relay lens 28N is arranged. And still further downstream on the optical path, the main condenser lens system 28R is arranged.

With the structure described above, the incident surface of the first fly-eye lens system 28C, the incident surface of the second fly-eye lens system 28G, the arrangement surface of the movable reticle blind of the reticle blind mechanism 28M, and the pattern surface of the reticle R are arranged optically conjugated with each other. The light source surface formed on the outgoing side of the first fly-eye lens system 28C, the light source surface formed on the outgoing side of the second fly-eye lens system 28G, and the Fourier transform surface of the projection optical system PL (exit pupil surface) are arranged optically conjugated with each other, forming a Koehler illumination system.

Operation of the illumination unit ILU having the structure described above, will now be briefly described. When the ultraviolet pulse light from the light source 12 enters the illumination unit ILU via the beam matching unit BMU, the variable beam attenuator 28A adjusts the beam to a predetermined peak intensity, and then the beam enters the beam shaping optical system 28B. The ultraviolet pulse light shape is then adjusted by the beam shaping optical system 28B, so that it can efficiently enter the first fly-eye lens system 28C arranged further downstream on the optical path. When the ultraviolet pulse light enters the first fly-eye lens system 28C next via the mirror 28F, a planar light source, that is, a secondary light source comprising many light source images (point light sources) is formed on the outgoing side of the first fly-eye lens system 28C. The ultraviolet pulse light released from each of these multiple point light sources enters the second fly-eye lens system 28G via the condenser lens system 28E and the vibrating mirror 28D which reduces speckles caused by coherence of the light source. As a result, a tertiary light source is formed in which multiple light source images are uniformly distributed within an area of a predetermined shape at the outgoing end of the second fly-eye lens system 28G. The ultraviolet pulse light emitted from this tertiary light source passes through an aperture stop on the illuminating system aperture stop plate 28H, and then reaches the beam splitter 28J having a large transmittance and a small reflectivity.

The ultraviolet pulse light serving as an exposure light having been reflected at the beam splitter 28J, passes through the first relay lens system 28K, and illuminates the opening of the fixed reticle blind which makes up the reticle blind mechanism 28M with a uniform intensity distribution. However, in the intensity distribution, interference fringes or tiny speckles that depend on the coherence of the ultraviolet pulse light from the light source 12 may be included by a contrast of several percent. Accordingly, on the wafer surface, an exposure amount variation may occur due to the interference fringes or tiny speckles. The exposure amount variation, however, is smoothed by vibrating the vibrating mirror 28D in synchronous with the movement of the reticle R and wafer W during scanning exposure and the oscillation of the ultraviolet pulse light, as is disclosed in the Japanese Patent Laid Open No. 07-142354, and the corresponding U.S. Pat. No. 5,534,970, referred to earlier.

The ultraviolet pulse light, having passed through the opening portion of the fixed reticle blind, then passes through the movable reticle blind and the second relay lens 28N, and then reaches the mirror 28Q where the optical path is deflected vertically downward. The ultraviolet pulse light then proceeds through the main condenser lens system 28R to illuminate a predetermined illumination area (a slit-shaped or rectangular illumination area extending linearly in the X-axis direction) on the reticle R held on the reticle stage RST, and illuminates the area with a uniform illuminance distribution. The illumination light irradiated on the reticle R is a rectangular shaped slit, and is set so as to narrowly extend in the X-axis direction (non-scanning direction) at the center of the circular projection view of the projection optical system PL shown in FIG. 1. The width of the illumination light in the Y-axis direction (scanning direction) is set substantially uniform.

Meanwhile, the ultraviolet pulse light having passed through the beam splitter 28J is then incident on the integrator sensor 34 via the condenser lens 32, and is photoelectrically converted. And the photoelectric conversion signal of the integrator sensor 34 is sent to the main controller 50, via a peak hold circuit and an A/D converter (not shown in Figs.). As the integrator sensor 34, for example, a PIN-type photodiode having sensitivity in the far ultraviolet region as well as a quick response time for detecting the emitted pulse beam of the light source 12 can be used. The correlation coefficient between the output of the integrator sensor 34 and the illuminance (exposure amount) of the ultraviolet pulse light on the surface of the wafer W is obtained in advance, and stored in the memory in the main controller 50.

The condenser lens 36 and the reflection light monitor 38, which is made of similar photodetection element as the integrator sensor 34, are arranged on the optical path of the light reflected off the reticle R within the illumination system housing 26. The reflected light from the pattern surface of the reticle R proceeds to the main condenser lens system 28R, the mirror 28Q, the second relay lens 28N, the movable reticle blind, the opening portion of the fixed reticle blind, and passes through the first relay lens 28K. It then passes through the beam splitter 28J, and enters the reflection light monitor 38 via the condenser lens 36, and is finally photoelectrically converted. The photoelectric conversion signal of the reflection light monitor 38 is sent to the main controller 50, via a peak hold circuit and an A/D converter (not shown in Figs.). The reflection light monitor 38 is mainly used to measure the transmittance of the reticle R.

The supporting structure of the illumination unit ILU will be described later on.

The reticle stage RST is arranged on the reticle base supporting bed 42, which is fixed horizontally above the supporting column 40 that make up the main column 14 which will be referred to later. The reticle stage RST is linearly driven with large strokes in the Y direction on the reticle base supporting bed 42, and also can be finely driven in the X direction and the θz direction (rotational direction around the Z-axis).

Figure 4:
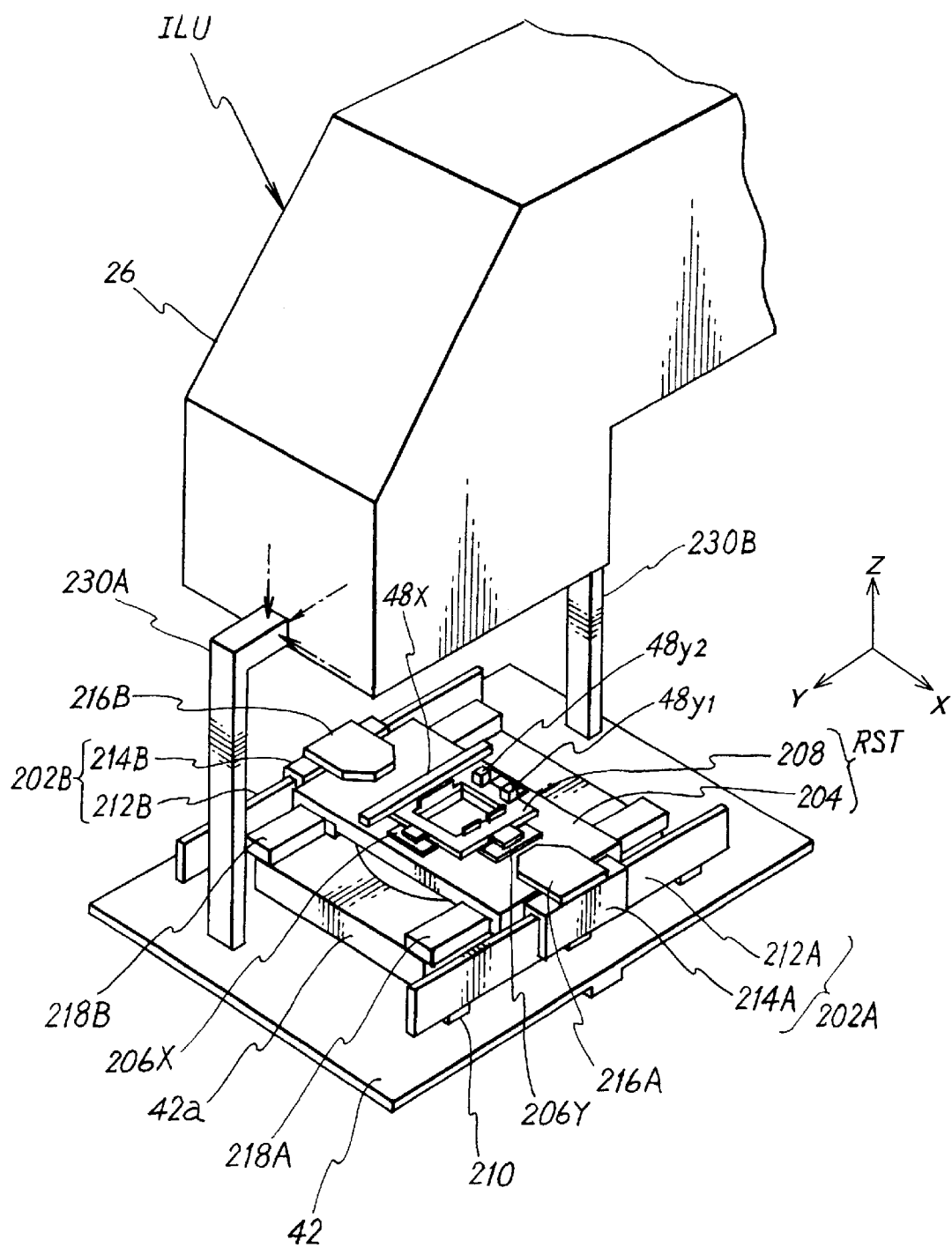
FIG. 4 is a perspective view showing the vicinity of the reticle stage shown in FIG. 1.

More particularly, as shown in FIG. 4, the structure of the reticle stage RST includes a reticle coarse movement stage 204 which is driven with predetermined strokes in the Y direction by a pair of Y linear motors 202A and 202B on the reticle base supporting bed 42. It also includes a reticle fine movement stage 208 which is finely driven in the X, Y, and θz direction by a pair of X voice coil motors 206X and a pair of Y voice coil motors 206Y on the reticle coarse movement stage 204.

Of the Y linear motors, the Y linear motor 202A is made up of a stator 212A, which is supported by air-levitation with a plurality of air bearings (air-pads) 210 and extending in the Y-axis direction, and a mover 214A arranged corresponding to the stator 212A and is attached to the reticle coarse movement stage 204 via a connecting member 216A. The other Y linear motor 202B, likewise with the Y linear motor 202A, is made up of a stator 212B, which is supported by air-levitation with a plurality of air bearings (not shown in Figs.) and extending in the Y-axis direction, and a mover 214B arranged corresponding to the stator 212B and is attached to the reticle coarse movement stage 204 via a connecting member 216B.

The reticle coarse movement stage 204 is guided in the Y-axis direction by a pair of Y guides 218A and 218B which is extends in the Y-axis direction and is fixed on the upper surface of an upward projecting portion 42a formed in the center portion of the reticle base supporting bed 42. The reticle coarse movement stage 204 is supported in a non-contact manner by air bearings (not shown in Figs.) in respect to these Y guides 218A and 218B.

On the reticle fine movement stage 208, an opening is formed in the center portion, and the reticle R is held by suction within the opening via a vacuum chuck not shown in Figs.

In this case, when the reticle coarse movement stage 204 moves integrally with the reticle fine movement stage 208 in the scanning direction (Y-axis direction), the mover 214A and 214B of the Y linear motor 202A and 202B attached to the reticle coarse movement stage 204 and the stator 212A and 212B relatively move in the opposite direction. That is, the reticle stage RST and the stator 212A and 212B relatively move in the opposite direction. In the case the friction between the reticle stage RST, the stator 212A and 212B, and the reticle base supporting bed 42 is zero, the law of conservation of momentum is valid, and the movement amount of the stator 212A and 212B accompanying the movement of the reticle stage RST is determined by the weight ratio of the entire reticle stage RST (the reticle coarse movement stage 204, the connecting member 216A and 216B, the movers 214A and 214B, the reticle fine movement stage 208, and the reticle R and the like) and the entire stator (the stator 212A and 212B, the air bearings 210, and the like). The reaction force generated by the acceleration of the reticle stage RST moving in the scanning direction is absorbed by the movement of the stator 212A and 212B, therefore, the vibration of the reticle base supporting bed 42 can be effectively suppressed. In addition, since the reticle stage RST and the stator 212A and 212B move in the opposite direction, the center of gravity of the system including the reticle stage RST and the reticle base supporting bed 42 is maintained at a predetermined position. Thus, the offset load due to the shift in the center of gravity position does not occur. The details of such structure, is disclosed in, for example, Japanese Patent Laid Open No. 08-63231, and the corresponding U.S. application Ser. No. 09/260,544. As long as the national laws in designated states or elected states, to which this international application is applied, permit, the disclosures cited above are fully incorporated herein by reference.

Referring back to FIG. 1, on an area of the reticle stage RST, a movable mirror 48 is arranged. This movable mirror 48 reflects the measurement beams from a reticle laser interferometer 46 serving as a positional detection unit to measure the position and the moving amount of the reticle stage RST. The reticle laser interferometer 46 is arranged fixed to the upper end portion of the supporting column 40.

More particularly, as. is shown in FIG. 4, on the edge portion of the reticle fine movement stage 208 in the -Y direction, a pair of Y movable mirrors $48_{y1}$ and $48_{y2}$, made of corner cubes are fixed, and on the edge portion of the reticle fine movement stage 208 in the -X direction, a movable mirror $48_x$, which is a flat mirror extending in the Y-axis direction, is fixed. And on the upper end portion of the supporting column 40, three laser interferometers that irradiate the measurement beams onto the respective movable mirrors $48_{y1}$, $48_{y2}$, and $48_x$, are fixed. However, in FIG. 1, for the sake of simplicity, they are representatively shown as the reticle laser interferometer 46 and the movable mirror 48. The fixed mirrors, corresponding to each laser interferometer, are arranged on the side surface of the barrel of the projection optical system PL, or within each the main body of each interferometer. The positional measurement of the reticle stage RST (to be more specific, the reticle fine movement stage 208) is performed by the three reticle laser interferometers in the X, Y, and θz direction with the projection optical system PL (or a portion of the main column) as the datum. However, in the following description, for the sake of convenience, the positional measurement in the X, Y, and θz direction are individually performed at the same time by the reticle laser interferometer 46, with the projection optical system PL (or a portion of the main column) as the datum. Also, in the following description, the Y linear motor 202A and 202B, the pair of X voice coil motor 206X, and the pair of Y voice coil motor 206Y will be described making up a driver 44 (refer to FIG. 3) which drives the reticle stage RST in the X, Y, and θz direction, as necessary.

Figure 3:
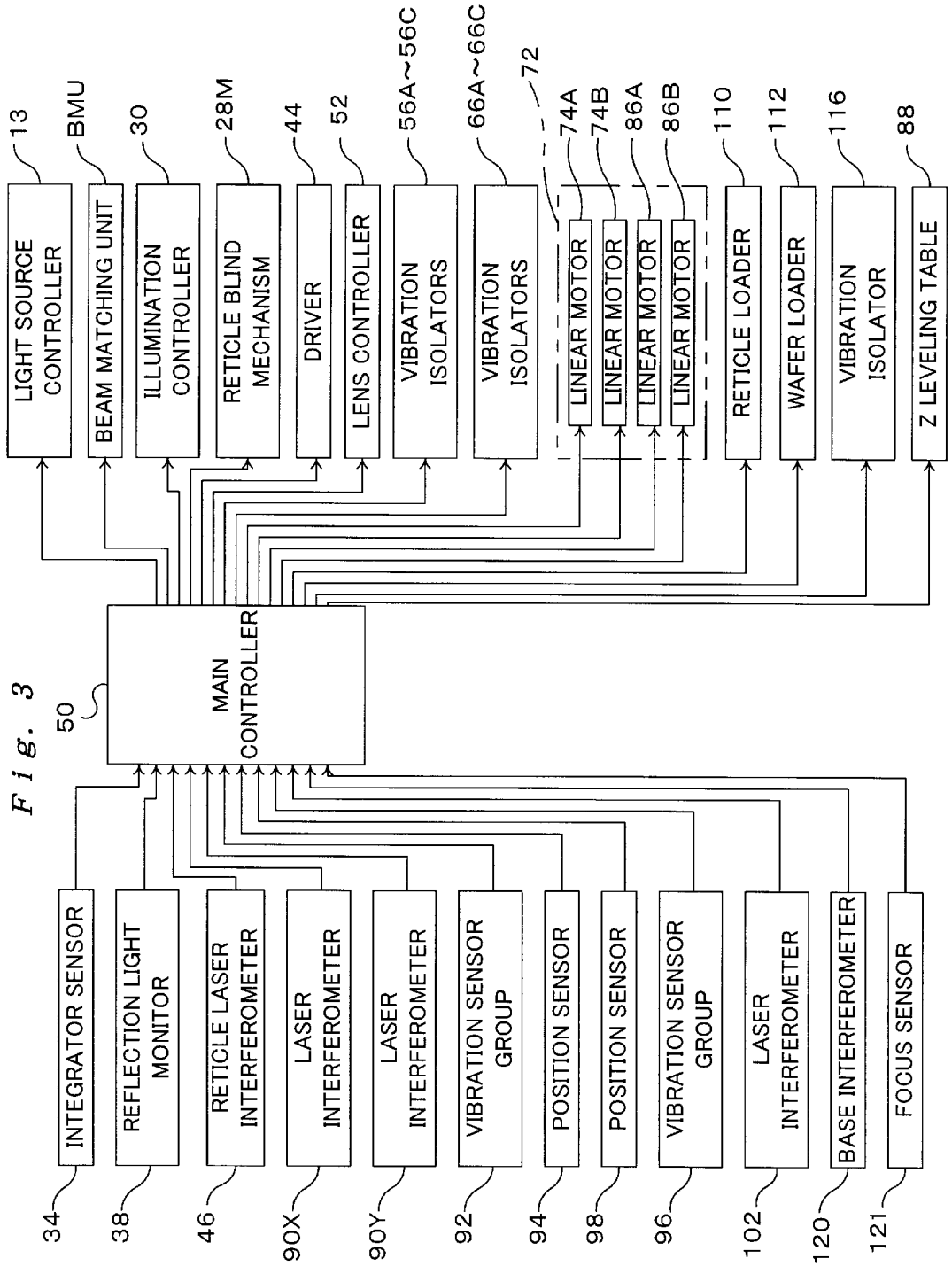
FIG. 3 is a block diagram showing an arrangement of the control system of the apparatus shown in FIG. 1.

The positional information (or the velocity information) of the reticle stage RST (in otherwords, the reticle R) measured by the reticle laser interferometer 46 is sent to the main controller 50 (refer to FIG. 3). The main controller 50 controls the linear motors and voice coil motors which structure the driver 44, so that the positional information (or velocity information) output from the reticle laser interferometer 46 coincides with the instructed values (target position, target velocity).

As the projection optical system, for example, a refraction optical system structured of only refraction optical elements (lens element) made of quartz or fluorite with a reduction magnification of ¼ (or ⅕) is used. This system is double telecentric on both the object surface (reticle R) side and the image surface (wafer W) side and has a circular projection field. Therefore, when the ultraviolet pulse light is irradiated on the reticle R, the light flux from the portion irradiated by the ultraviolet pulse light of the circuit pattern area on the reticle R is incident on the projection optical system PL. Thena partial inverted image of the circuit pattern is formed in the center of the circular field on the image surface side of the projection optical system PL, being limited in a slit shape or a rectangular shape (a polygonal shape) per each irradiation of the ultraviolet pulse light. With this operation, the partial inverted image of the circuit pattern projected is reduced and transferred onto a resist layer applied on the surface of a shot area among a plurality of shot areas on the wafer W arranged at the imaging surface of the projection optical system PL.

The projection optical system (PL) may, of course, be the so-called catadioptric system which is a system with reflection optical elements (a concave mirror and a beam splitter and the like) and refraction optical elements combined, which details are disclosed in, for example, Japanese Patent Laid Open No. 03-282527, and the corresponding U.S. Pat. No. 5,220,454. As long as the national laws in designated states or elected states, to which this international application is applied, permit, the disclosures cited above are fully incorporated herein by reference.

Furthermore, in the embodiment, an image distortion correction plate 51 is arranged in between the projection optical system PL and the reticle R, so as to effectively reduce the dynamic distortion aberration generated during scanning exposure, particularly to reduce the random distortion component included in the projection image formed in the effective image projection area (set by the opening portion of the fixed reticle blind) within the circular field. The image distortion correction plate 51 is a quartz plate, running parallel with a thickness of several mm, and the surface is locally polished in the wavelength order, so that the primary light flux passing through the polished area is deflected by a small amount. An example of making such a correction plate, is disclosed in detail in, for example, Japanese Patent Laid Open No. 08-203805, and the corresponding U.S. application Ser. No. 08/581,016, and in the embodiment the techniques shown in these disclosures are applied. As long as the national laws in designated states or elected states, to which this international application is applied, permit, the disclosures cited above are fully incorporated herein by reference.

In addition, in the projection optical system PL, an actuator 51A and 51B are provided so as to automatically adjust the image forming characteristics (the projection magnification, or certain types of distortion) by parallel translation or moving finely a particular lens element within the projection optical system PL. This adjustment is performed based on the detection result of the state of distortion of the shot area on the wafer W which is to be exposed, the detection result of the temperature change of the media (optical elements and the gas filled) in the optical path of the projection optical system, and the detection result of the change in the internal pressure within the projection optical system PL due to the change in atmospheric pressure. These actuators 51A and 51B are controlled by the lens controller 52 (not shown in FIG. 1, refer to FIG. 3), which is under the control of the main controller 50.

The main column 14 consists of three struts 54A to 54C (the strut 54C in the depth of FIG. 1 is not shown, refer to FIG. 2), which are arranged on the first position setting supporting bed BP1 serving as the first base member and the datum of the apparatus arranged horizontally on the floor FD, the barrel supporting bed 58 which is supported almost horizontally via the vibration isolators 56A to 56C (the vibration isolator 56C in the depth of FIG. 1 is not shown, refer to FIG. 2) fixed on the upper portion of the struts 54A to 54C serving as the first vibration isolator, and the supporting column 40 which stands on the barrel supporting bed 58.

As the position setting supporting bed BP1, in the embodiment, a rectangular-shaped member which has a rectangular opening formed in a planar view, that is a rectangular-shaped frame member is used.

Figure 2:
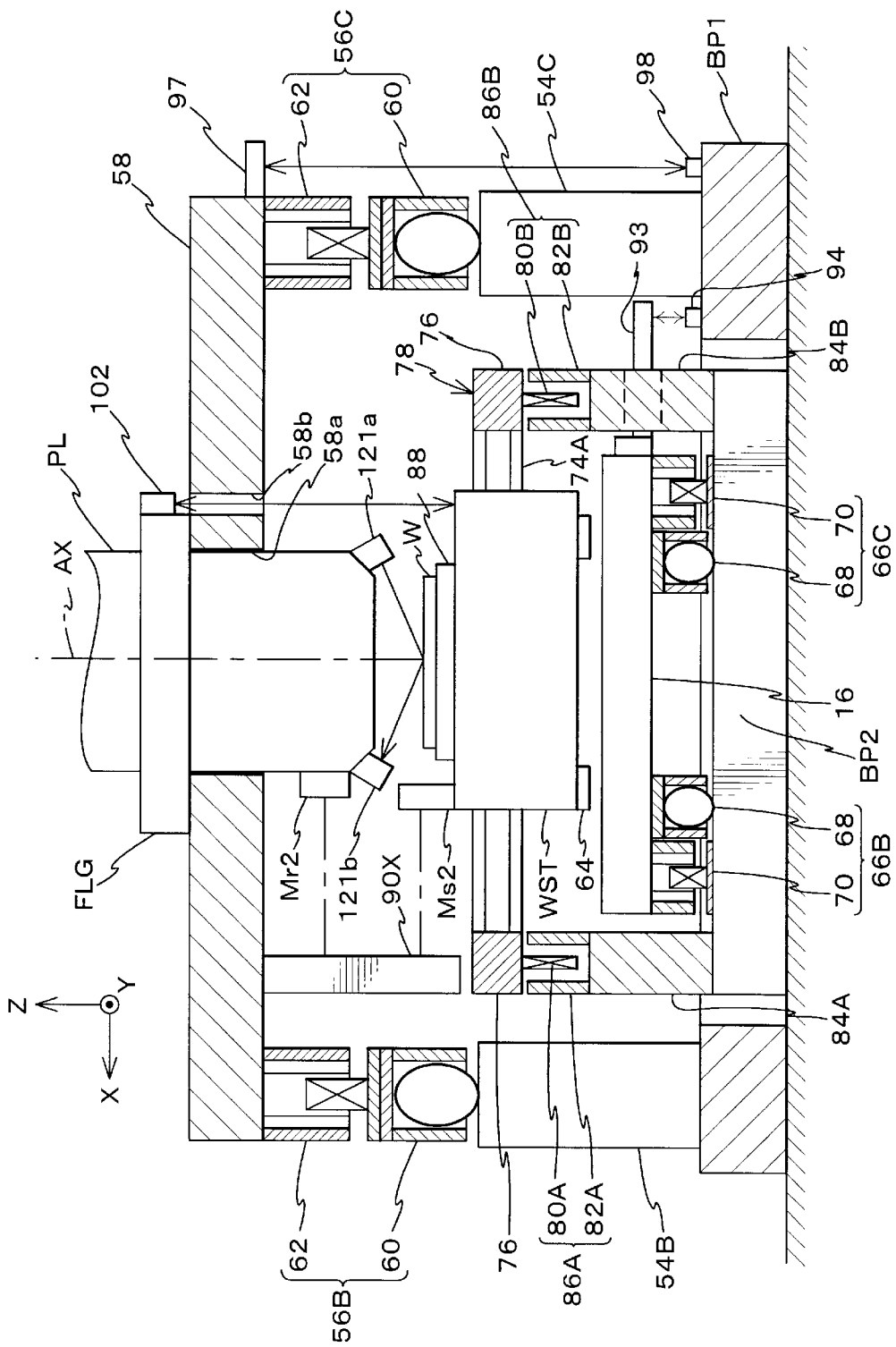
FIG. 2 is a partially sectional view of the right side view of FIG. 1, which shows the arrangement of a portion of the main column in the apparatus in FIG. 1 below the barrel supporting bed.

FIG. 2 shows the structure below the barrel supporting bed 58 which make up a part of the main column 14 of the exposure apparatus 10 in FIG. 1. It is the right side view of FIG. 1, partially sectioned. As is shown in FIG. 2, with the vibration isolator 56B, it includes an air mount 60 which the internal pressure is adjustable and a voice coil motor 62 arranged in series on top of the strut. 54B. The remaining vibration isolators 56A and 56C are similarly arranged, with an air mount 60 and a voice coil motor 62 arranged in series on top of the struts 54A and 54C. And by these vibration isolators 56A to 56C, the subtle vibration travelling from the floor surface FD to the barrel supporting bed 58 via the first position setting supporting bed BP1 and the struts 54A to 54C is isolated at a micro-G level.

The barrel supporting bed 58 is made of a casting or the like, and the projection optical system PL is inserted from above, in a circular opening 58a around the center portion of the barrel supporting bed 58, with the direction of the optical axis AX of the projection optical system PL, is the Z-axis direction. Around the periphery of the barrel portion of the projection optical system PL, a flange FLG is provided, integrally connected with the barrel portion. As the material of the flange FLG, a material having a low thermal expansion, such as Invar (a heat resistant alloy made of nickel 36%, manganese 0.25%, and metal including carbon and other elements) is used. The flange FLG structures a so-called kinematic supporting mount, which supports the projection optical system in respect to the barrel supporting bed 58.

Figure 5:
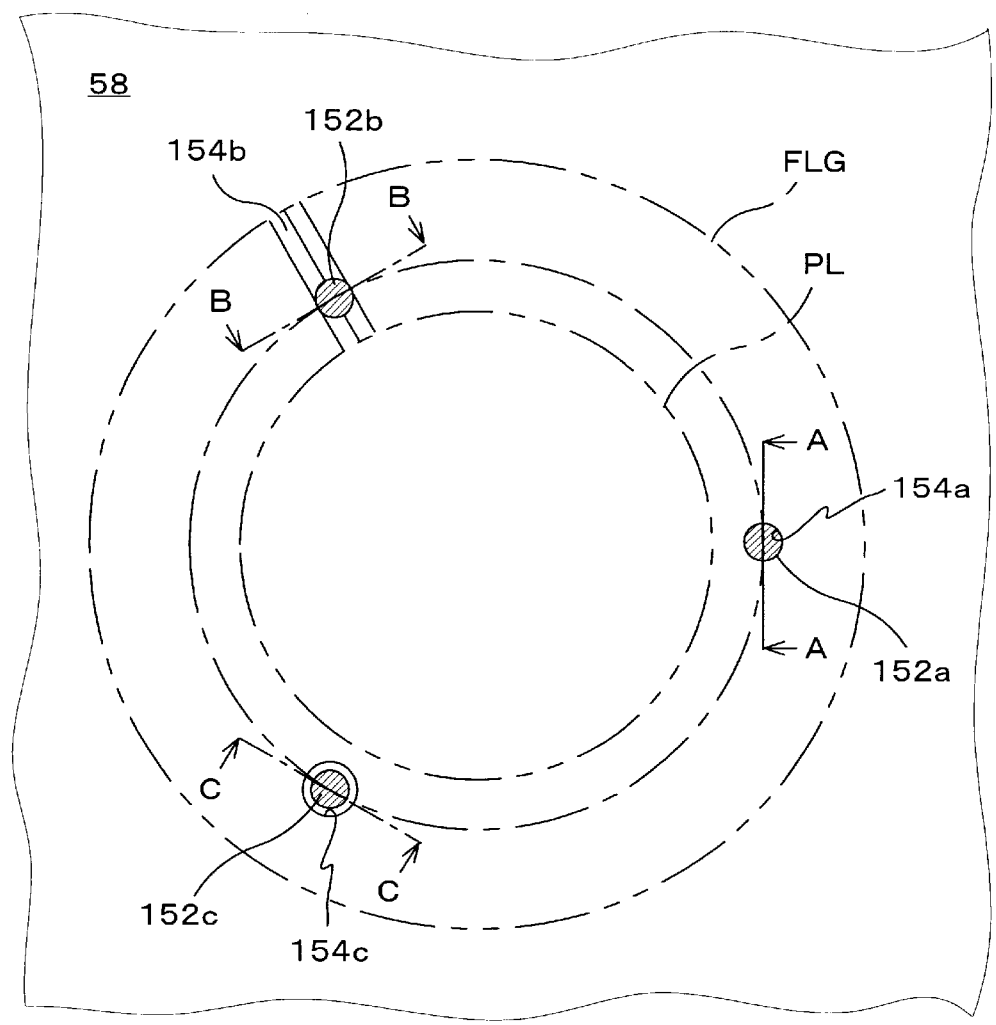
FIG. 5 planar view of a part of the barrel supporting bed facing flange FLG.
Figure 6A:
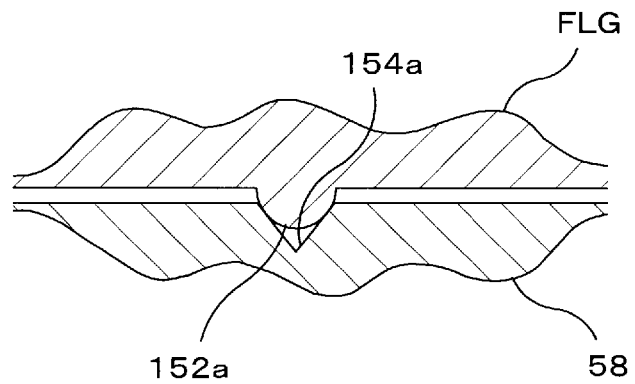
FIG. 6A is a sectional view of the line A—A shown in FIG. 5.
Figure 6B:
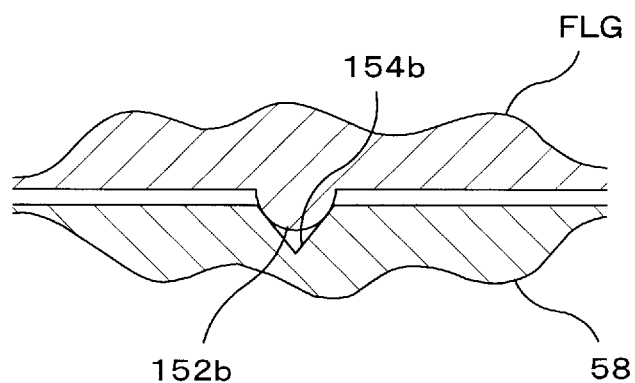
FIG. 6B is a sectional view of the line B—B shown in FIG. 5.
Figure 6C:
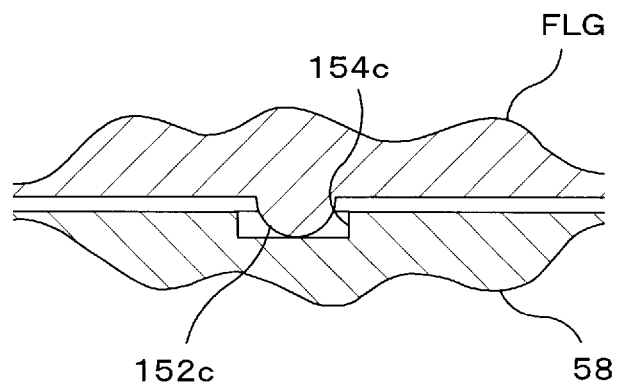
FIG. 6C is a sectional view of the line C—C shown in FIG. 5.

The structure of the kinematic supporting mount will be briefly described with reference to FIG. 5 and FIGS. 6A to 6C. FIG. 5 is a planar view of a portion of the barrel supporting bed 58 that face the flange FLG, and FIGS. 6A, 6B, and 6C are sectional views of the line A—A, B—B, and C—C shown in FIG. 5.

As is obvious on the whole from these drawings, on the lower surface of the flange. FLG, on the circumference of a circle almost concentric with the projection optical system PL, three semi-spherical shaped projected portions 152a, 152b, and 152c are integrally formed at an angle of 120 degrees. And a conical groove 154a, a V groove 154b, and a loose fitting groove (a circular hole with a flat inner bottom surface) 154c into which the projected portions 152a, 152b, and 152c respectively fit are formed on the upper surface of the barrel supporting bed 58. When the three projected portions 152a, 152b, and 152c and the conical groove 154a, the V groove 154b, and the loose fitting groove 154c are in a state of being fitted into to each other, the projection optical system PL is supported by what is known as the kinematic support via the flange FLG. By employing such a kinematic support mount, simplifies the incorporation of the projection optical system PL to the barrel supporting bed 58, and moreover there are advantages of stress due to the vibration of the barrel supporting bed 58 and the projection optical system PL, temperature change, and posture being most effectively reduced after incorporation.

Next, the structure of the vicinity of the wafer stage WST will be respectively described referring to FIG. 1 and FIG. 2.

As shown in FIG. 2, on the bottom surface of the wafer stage WST, a plurality of air bearings (air pads) 64 are fixed, and by these air bearings 64 the wafer stage WST is supported by air levitation on the stage supporting bed 16 with a clearance around several microns.

The stage supporting bed 16 is held almost horizontally via the three vibration isolators 66A to 66C (the vibration isolator 66C in the depth of FIG. 1, is not shown, refer to FIG. 2) that serve as the second vibration isolator including active actuators, above the second position setting supporting bed BP2. The second position setting supporting bed BP2 mounted on the floor FD, serves as the second base member, and is arranged within the rectangular opening portion of the first position setting supporting bed BP1 referred to earlier. The vibration isolator 66B, as shown in FIG. 2, includes an air mount 68 and a voice coil motor 70. The remaining vibration isolators 66A and 66C are similarly arranged, with an air mount 68 and a voice coil motor 70. And by these vibration isolators 66A to 66C, the subtle vibration travelling from the floor surface FD to the stage supporting bed 16 via the second position setting supporting bed BP2 is isolated at a micro-G level.

With the wafer stage WST, the stage supporting bed 16 is driven in the XY two dimensional direction by the driver 72 (not shown in FIG. 1, refer to FIG. 2) that include two sets of linear motors. More particularly, the pair of linear motors 74A and 74B shown in FIG. 1, drive the wafer stage WST in the X direction. The stators of these linear motors 74A and 74B are arranged on both outer sides of the wafer stage WST in the Y direction, and extend along in the X direction. The end portion in the X direction are connected to a pair of connecting members 76, and form a rectangular frame 78 (refer to FIG. 2). The movers of the linear motors 74A and 74B are arranged projecting on both outer sides of the wafer stage WST in the Y direction.

In addition, as is shown in FIG. 2, on the lower end surface of the pair of connecting members 76 or the linear motors 74A and 74B that make up the frame 78, armature units 80A and 80B are respectively arranged, and corresponding to these armature units a pair of magnetic units 82A and 82B are arranged extending in the Y direction. These magnetic units 82A and 82B are fixed on the upper surface of a pair of frames 84A and 84B which is also arranged extending in the Y direction on the upper surface of the second position setting supporting bed BP2. In this case, the armature unit 80A and the magnetic unit 82A structure a linear motor 86A of a moving coil type, and similarly the armature unit 80B and the magnetic unit 82B structure a linear motor 86B, also a moving coil type. And by these linear motors 86A and 86B, the wafer stage WST is driven in the Y direction integrally with the frame 78.

That is, in this manner, the driver 72 is structured, which includes the two sets of linear motors 74A, 74B, and 86A and 86B. And by this driver 72, the wafer stage WST is driven two dimensionally on an XY plane which is parallel to the image plane of the projection optical system PL. In the embodiment, since the driver 72 is supported independently by the frame 84A and 84B arranged on the outer side of the stage supporting bed 16, the reaction force caused when the wafer stage WST is accelerated or decelerated within the XY plane directly travels to the second position setting supporting bed BP2 via the frame 84A and 84B, but does not travel to the stage supporting bed 16.

On the upper surface of the wafer stage WST, the wafer W is fixed by vacuum chucking and the like, via the wafer holder 88. The XY position of the wafer stage WST is measured real time by the laser interferometer 90Y and 90X, which measures the positional change of the movable mirrors Ms1 and Ms2 fixed on a part of the wafer stage WST with reference mirrors Mr1 and Mr2 fixed to the lower end of the barrel of the projection optical system PL as a datum as is shown in FIG. 1 and FIG. 2, by a predetermined resolution, for example a resolution of around 0.5 to 1 nm. The measurement values of the interferometer 90Y and 90X is sent to the main controller 50 (refer to FIG. 3). That is, the interferometers 90Y and 90X make up the interferometer system that measures the position of the wafer stage WST with the projection optical system as a datum. And, at least either one of the interferometers 90Y and 90X, is a multiple axis interferometer, which has two or more measurement axes. Accordingly, based on the measurement values of the interferometers 90Y and 90X, the main controller 50 not only can obtain the XY position of the wafer stage WST, but also can obtain the θz rotational amount, or in addition, the leveling amount of the wafer stage WST.

The wafer holder 88, is actually driven by the holder driving mechanism (not shown in FIG.) mounted on the wafer stage WST, although it is omitted in FIG. 2. The holder driving mechanism holds the wafer W and finely drives the wafer in the Z direction in respect to the wafer stage WST and in the tilting direction in respect to the XY plane. The holder driving mechanism can be structured, for example, supporting three different points of the wafer holder 88, and also independently driving each supporting point in the Z direction which arrangement include actuators made up of three voice coil motors or piezo elements. That is, in the embodiment, the wafer holder 88 and the holder driving mechanism make up a Z leveling table serving as a substrate driving system that drives the wafer W in directions of three degrees of freedom, in other words, the Z direction, the θx direction (rotational direction around the X-axis), and the θy direction (rotational direction around the Y-axis). The wafer holder 88 will hereinafter be referred to as the "Z leveling table 88" for the sake of convenience, as appropriate. In this embodiment, each actuator which make up the Z leveling table 88 is controlled by the main controller 50 (refer to FIG. 3)

In addition, in the embodiment, corresponding to the Z leveling table 88, a focus sensor 121 is arranged on the side surface of the projection optical system PL. The focus sensor 121 serves as a focus detector, and detects the distance between the focus position of the projection optical system PL and the upper surface of the wafer W (surface), or the value corresponding to the distance, for example, the position of the surface of the wafer W in the Z-axis direction in respect to the image plane of the projection optical system PL, and the tilt in respect to the XY plane. As the focus sensor 121, as is shown in FIG. 2, a multiple focal position detection system is employed that is made up of a light projecting portion (illumination optical system) 121*a* by which the detection light is incident on the wafer W, and a photodetecting portion (photodetection optical system) 121*b* which detects the detection light reflected on the wafer W. The output (detection result) of the focus sensor 121 (photodetecting portion 121*b*) is sent to the main controller 50 (refer to FIG. 3), and the main controller 50 controls the Z leveling table 88 so that the shot area on the wafer W (to be more precise, the area on the wafer W conjugate with the slit shaped illumination area of the reticle R) coincides (within the range of a predetermined depth of focus) with the image plane of the projection optical system PL at all times, based on the output of the focus sensor 121. That is, in this manner, what is called focus leveling control is performed. The details of the multiple focal position detection system similar to the focus sensor 121, are disclosed in, for example, Japanese Patent Laid Open No. 06-283403, and the corresponding U.S. Pat. No. 5,448,332. As long as the national laws in designated states or elected states, to which this international application is applied, permit, the disclosures cited above are fully incorporated herein by reference.

Furthermore, the light projecting portion 121*a* and the photodetecting portion 121*b* may be fixed to the barrel supporting bed 58, instead of being fixed to the projection optical system PL.

On the stage supporting bed 16, although it is omitted in FIG. 1 and FIG. 2, in actual, three vibration sensors (for example, accelerometers) are arranged to measure the vibration of the stage supporting bed 16 in the Z direction. Another three vibration sensors (for example, accelerometers) (for example, of the three vibration sensors two measure the vibration of the stage supporting bed 16 in the Y direction, and the remaining measures the vibration in the X direction) are also arranged on the stage supporting bed 16 to measure the vibration in the XY plane direction. In the following description, these six vibration sensors will be collectively referred to as the vibration sensor group 92 for the sake of convenience. The measurement values of the vibration sensor group 92 are sent to the main controller 50 (refer to FIG. 3). Accordingly, the main controller 50 can obtain the vibration of the stage supporting bed 16 based on the measurement values of the vibration sensor group 92 in directions of six degrees of freedom (X, Y, Z, θx, θy, and θz).

In addition, as is described previously, the reticle stage used in the embodiment employs what is called a counterweight method, as is,disclosed in the Japanese Patent Laid Open No. 08-63231, and the corresponding U.S. application Ser. No. 09/260,544, which is referred to earlier. Therefore, if the friction between the reticle stage RST, the stators (212A and 212B), and the reticle stage supporting bed 42 is null, the reaction force/offset load caused with the movement of the reticle stage RST is theoretically also null. However, in actual, since the friction is not null, and in addition, since the line of action of the force differs, the reaction force/offset load caused with the movement of the reticle stage RST is not null.

Therefore, on the barrel supporting bed 58 which structure the main column 14, although it is omitted in FIG. 1 and FIG. 2, in actual, three vibration sensors (for example, accelerometers) are arranged to measure the vibration of the main column 14 in the Z direction. Another three vibration sensors (for example, accelerometers) (for example, of the three vibration sensors two measure the vibration of the main column 14 in the Y direction, and the remaining measures the vibration in the X direction) are also arranged on the stage supporting bed 16 to measure the vibration in the XY plane direction. In the following description, these six vibration sensors will be collectively referred to as the vibration sensor group 96 for the sake of convenience. The measurement values of the vibration sensor group 96 are sent to the main controller 50 (refer to FIG. 3). Accordingly, the main controller 50 can obtain the vibration of the main column 14 based on the measurement values of the vibration sensor group 96 in directions of six degrees of freedom.

In addition, in the embodiment, since the stage supporting bed 16 and the barrel supporting bed 58 are respectively supported separately by the second position setting supporting bed BP2 and the first position setting supporting bed BP1, as is described earlier, the positional relationship between the stage supporting bed 16 and the barrel supporting bed 58 needs to be confirmed.

Therefore, as is shown in FIG. 2, on the first position setting supporting bed BP1, a position sensor 98 serving as a column position measurement unit (and a position measurement system) which measures the position of the barrel supporting bed 58 in respect to the first position setting supporting bed BP1 via the target 97 fixed to the barrel supporting bed 58, and a position sensor 94 serving as a stage supporting bed measurement unit which measures the position of the stage supporting bed 16 in respect to the first position setting supporting bed BP1 via the target 93 fixed to the stage supporting bed 16, are arranged.

Figure 7:
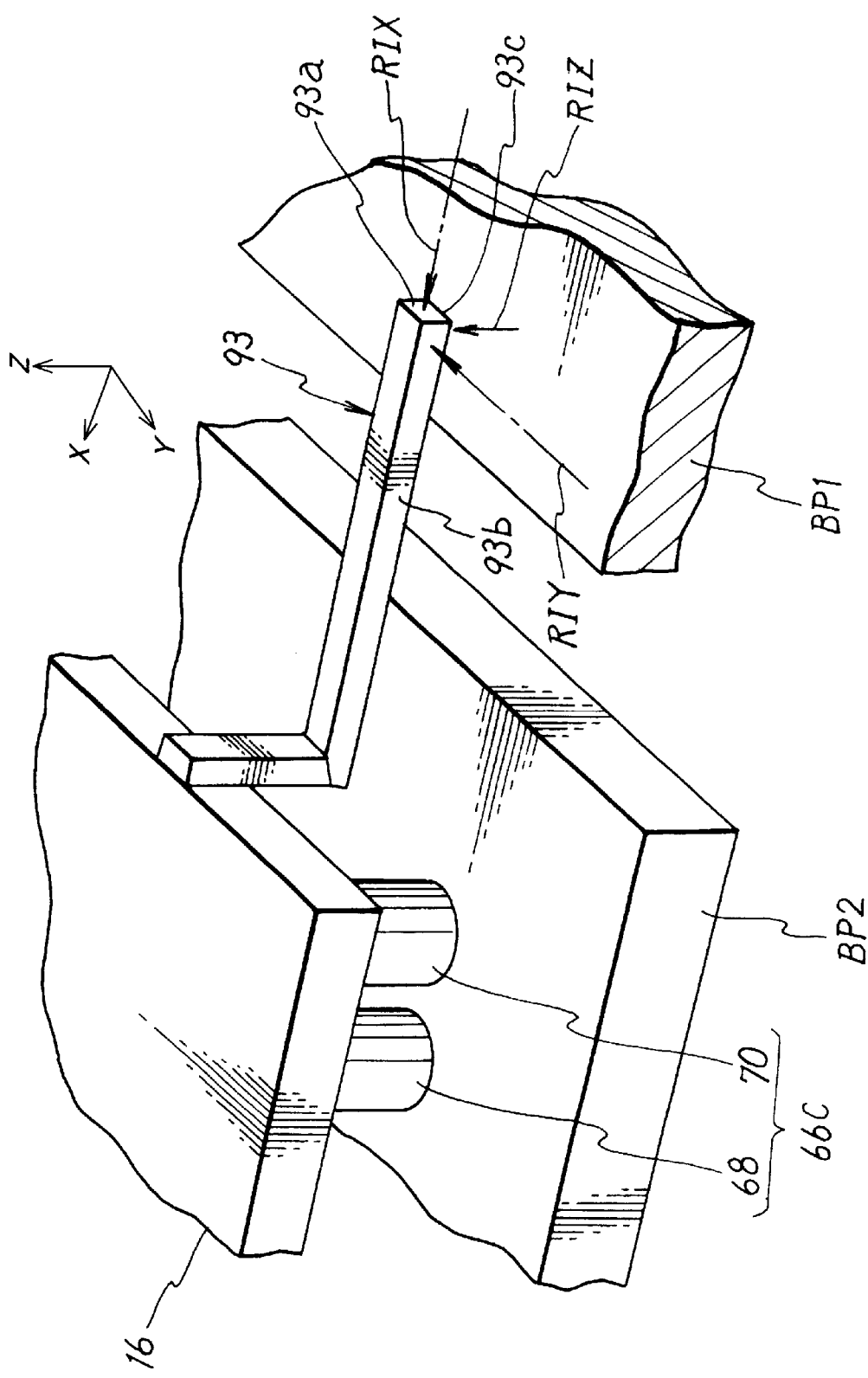
FIG. 7 is a view for explaining an arrangement of the position sensor which measures the positional relationship between the position setting supporting bed BP1 and the stage supporting bed 16 shown in FIG. 1.

As the target 93, for example, as is shown in FIG. 7, an L-shaped member which base end is fixed to the stage supporting bed 16, and has reflection surfaces 93*a*, 93*b*, and 93*c* being perpendicular to the X, Y, and Z-axes formed on the tip portion, is used. In this case, as the position sensor 94, a laser interferometer that irradiates measurement beams RIX, RIY, and RIZ respectively to the reflection surfaces 93*a*, 93*b*, and 93*c* can be used. In this embodiment, by using multiple sets of such target 93 and laser interferometer 94, the Z position, the X position, and the Y position of the stage supporting bed 16 are respectively measured at, at least two points. However, hereinafter, for the sake of convenience, the position sensor 94 in FIG. 2 is to measure six relative positions, referred to above, between the first position setting supporting bed BP1 and the stage supporting bed 16. The measurement values of the position sensor 94 is to be sent to the main controller 50 (refer to FIG. 3).

The position sensor 98 is structured likewise with the position sensor 94, and the Z position, the X position, and the Y position of the barrel supporting bed 58 are respectively measured at, at least two points. However, hereinafter, for the sake of convenience, the position sensor 98 in FIG. 2 is to measure six relative positions, referred to above, between the first position setting supporting bed BP1 and the barrel supporting bed 58. The measurement values of the position sensor 98 is also to be sent to the main controller 50 (refer to FIG. 3).

Accordingly, the main controller 50 can obtain the positional relationship between the first position setting supporting bed BP1 and the stage supporting bed 16 based on the measurement values of the position sensor 94 in directions of six degrees of freedom. And the main controller 50 can also obtain the positional relationship between the first position setting supporting bed BP1 and the barrel supporting bed 58 based on the measurement values of the position sensor 98 in directions of six degrees of freedom.

In this embodiment, the reaction force caused when the wafer stage WST is driven does not directly travel to the stage supporting bed 16, however a small amount of the reaction force may travel through the frame 84A and 84B via the second position setting supporting bed BP2, and become the vibration cause of the stage supporting bed 16. In such a case, the main controller 50 controls the velocity of the vibration isolators 66A to 66C by feedback control, so that the vibration of the stage supporting bed 16 in directions of six degrees of freedom obtained by the measurement values of the vibration sensor group 92 is removed, and the vibration can be suppressed without fail. In addition, when the wafer stage WST moves on the stage supporting bed 16, the center of gravity position of the stage supporting bed 16 also moves which generates an offset load. When this occurs, it is possible to correct the tilt of the stage supporting bed 16 due to the offset load based on the position signals from the laser interferometer 90X and 90Y. As can be seen, what is called the active vibration unit is employed for the vibration units 66A to 66C. And, the main controller 50 obtains the positional relationship between the first position setting supporting bed BP1 and the stage supporting bed 16 based on the measurement values of the position sensor 94 in directions of six degrees of freedom, and based on this information, controls the vibration units 66A to 66C so that the stage supporting bed 16 can be maintained at a stable position at all times with the first position setting supporting bed BP1 as a datum.

In addition, the main controller 50 can for example, control the velocity of the vibration isolators 56A to 56C by feedback control or feed-forward control, so that the vibration of the main column 14 which may occur with the movement of the reticle stage RST, and the like, in directions of six degrees of freedom obtained by the measurement values of the vibration sensor group 96 is removed, and the vibration can be effectively suppressed. That is, what is called the active vibration unit is employed for the vibration units 56A to 56C. The main controller 50 also obtains the positional relationship of the main column 14 in respect to the first position setting supporting bed BP1, in directions of six degrees of freedom based on the measurement values of the position sensor 98. And by using this information on the positional relationship, the main controller 50 controls the vibration units 56A to 56C so that the barrel supporting bed 58 can be maintained at a stable position at all times with the first position setting supporting bed BP1 as a datum.

Furthermore, in this embodiment, as shown in FIG. 2, three laser interferometers 102 are fixed on three different areas on the flange FLG of the projection optical system PL (however, only one of these interferometers are represented in FIG. 2.)

With the barrel supporting bed 58, on the area facing these three laser interferometers 102, openings 58b are respectively formed. And through these openings 58b, measurement beams are irradiated in the Z-axis direction toward the stage supporting bed 16 from the laser interferometers 102. On the upper surface of the stage supporting bed 16 at the areas where the measurement beams reach, reflection surfaces are respectively formed. Therefore, by the three laser interferometers 102, the Z position of the stage supporting bed 16 is measured at three different points with the flange FLG as a datum. However, in FIG. 2, since it shows the state where the center of the shot area of the wafer W on the wafer stage WST coincides with the optical axis AX of the projection optical system, the measurement beams are cut off by the wafer stage WST. Furthermore, the reflection surfaces may be formed on the upper surface of the wafer stage WST, and the interferometers may measure the Z position of the wafer stage WST at three different points with the projection optical system PL or the flange FLG as a datum.

In addition, instead of fixing the three interferometers 102 to the flange FLG, the three interferometers may be fixed to the barrel supporting bed 58 so that the position in the Z direction of the stage supporting bed 16 or wafer stage WST is measured with the barrel supporting bed 58 as a datum.

The measurement values of the laser interferometers 102 are also sent to the main controller 50 (refer to FIG. 3). And the main controller 50 can for example, obtain the positional relationship between the projection optical system PL and the stage supporting bed 16 in directions of three degrees of freedom (Z, θx, and θy), which are the direction of the optical axis AX of the projection optical system PL and in the tilt direction in respect to the plane perpendicular to the optical axis. That is, in this embodiment, the laser interferometers 102 and the main controller 50 make up a three degrees of freedom position measurement unit.

Referring back to FIG. 1, on the first position setting supporting bed BP1, a reticle loader 110 serving as a mask carriage system which loads and unloads the reticle R onto and from the reticle stage RST is arranged. A wafer loader 112 is also arranged on the first position setting supporting bed BP1, serving as a substrate carriage system which loads and unloads the wafer W onto and from the wafer stage WST. The main controller 50 controls both the reticle loader 110 and the wafer loader 112 (refer to FIG. 3).

With the main controller 50, for example, when it exchanges a reticle, it controls the reticle loader 110 based on the measurement values of the reticle laser interferometer 46 and the measurement values of the position sensor 98 so that it can keep the position of the reticle stage RST fixed at all times with the first position setting supporting bed BP1 as a datum, during carriage. Consequently, the reticle R can be loaded on the desired position on the reticle stage RST.

Similarly, when the wafer is exchanged, the main controller 50 controls the wafer loader 112 based on the measurement values of the laser interferometers 90X and 90Y, and the measurement values of the position sensor 94 so that it can keep the position of the wafer stage WST fixed at all times with the first position setting supporting bed BP1 as a datum. Consequently, the wafer W can be loaded on the desired position on the wafer stage WST.

The illumination unit ILU is supported by a supporting column 118, which is mounted on a third position setting supporting bed BP3 serving as a third base member arranged on the floor FD independently from the first and second position setting supporting beds BP1 and BP2, via a vibration isolator 116 that supports at three points. With the vibration isolator 116, likewise with the vibration isolators 56A to 56C and 66A to 66C, an active vibration unit which comprises an air mount and a voice coil motor (actuator) and vibration detection sensors (for example, accelerometers) attached to the supporting column 118. And the vibration travelling from the floor surface FD is isolated at a micro-G level by the active vibration isolator 116.

Furthermore, in this embodiment, the apparatus comprises a base interferometer 120 (refer to FIG. 3) serving as a six degrees of freedom position measurement unit which measures the positional relationship between the illumination unit ILU and the reticle base supporting bed 42 in directions of six degrees of freedom.

More particularly, as is shown in FIG. 4, on the upper surface of the reticle base supporting bed 42, a pair of targets 230A and 230B which are made from the same L-shaped member as of the target 93 referred to earlier are fixed facing the illumination unit ILU. And on the illumination system housing 26 of the illumination unit ILU, a total of six laser interferometers (not shown in FIG. 4) to measure the position of the targets 230A and 230B in each the X, Y, and Z directions are fixed. These six laser interferometers make up the base interferometer 120 shown in FIG. 3. The six measurement values from the base interferometer 120, that is positional information (deviation information) of the two points in the X, Y, and Z directions, is sent to the main controller 50. And the main controller 50 can obtain the positional relationship between the illumination unit ILU and the reticle base supporting bed 42 in directions of six degrees of freedom (in the X, Y, Z, θx, θy, and θz directions) based on the six measurement values of the base interferometer 120.

Accordingly, the main controller 50 finely adjusts the positional relationship between the illumination unit ILU and the reticle R in directions of six degrees of freedom, by adjusting the position of the reticle stage RST (reticle fine movement stage 208) within the XY plane via the driver 44 and controlling the vibration isolator 56A to 56C or the active vibration isolator 116, based on the positional relationship obtained earlier in directions of six degrees of freedom from the measurement values of the base interferometer 120.

In addition, the main controller 50 controls the vibration units 56A to 56C based on the measurement values of the vibration sensor group 96 so as to suppress the rough vibration of the main column 14, and can also control the position of the reticle stage RST (reticle fine movement stage 208) based on the measurement values of the base interferometer 120 so as to effectively suppress the subtle vibration of the main column 14.

FIG. 3 briefly shows the control system of the exposure apparatus 10 described above. In this control system, the main controller 50, being a workstation (or a microcomputer), plays the central role. Other than the various controls that has been described so far, the main controller 50 controls the apparatus as a whole.

Next, the exposure operations of the exposure apparatus 10 in this embodiment having the arrangement above will be described.

As a premise, various conditions are set beforehand so that the shot areas on the wafer W is scanned and exposed by a suitable exposure amount (target exposure amount). In addition, preparatory operations such as reticle alignment and baseline measurement using the reticle microscope and the off-axis alignment sensor (both not shown in Figs.) are performed, and after the preparatory operations above have been completed, fine alignment (such as EGA (enhanced global alignment)) of the wafer W using the alignment sensors is performed. Then, the arrangement coordinates of the plurality of shot areas on the wafer W are obtained.

When all of the preparatory operations have been completed to perform exposure on the wafer W, the main controller 50 then moves the wafer stage WST to the scanning starting position based on the alignment results, by controlling the driver 72 while monitoring the measurement values of the laser interferometers 90X and 90Y.

Then, the main controller 50 begins to scan the reticle stage RST and wafer stage WST via the drivers 44 and 72, and when the stages respectively reach the target scanning velocity, scanning exposure begins by the ultraviolet pulse light irradiating the pattern area of the reticle R.

The light source 12 starts to emit the ultraviolet pulse light prior to the start of scanning exposure, however, since the movement of each blade of the movable blind structuring the reticle blind mechanism 28M is controlled in synchronous with the movement of the reticle stage RST by the main controller 50, the ultraviolet pulse light irradiating the area other than the pattern area of the reticle R is cut off, likewise with the scanning steppers.

The main controller 50 synchronously controls the reticle stage RST and the wafer stage WST via the driver 44 and the driver 72, particularly during the scanning exposure described above, so that the velocity ratio of the movement velocity Vr of the reticle stage RST in the Y-axis direction and the movement velocity Vw of the wafer stage WST in the Y-axis direction is maintained to correspond to the projection magnification (⅕ or ¼) of the projection optical system PL. That is, in this embodiment, the driver 44, the driver 72, and the main controller 50 make up a driver that moves the reticle R and the wafer W in synchronous along the Y-axis direction.

And when different areas on the pattern area of the reticle R are sequentially illuminated by the ultraviolet pulse light and the entire pattern area has been illuminated, the scanning exposure of the first shot area on the wafer W is completed. In this manner, the pattern of the reticle R is reduced and transferred onto the first shot area via the projection optical system PL.

On completing the scanning exposure on the first shot area in this manner, the main controller then steps the wafer stage WST via the driver 72 in the Y-axis direction, and moves the wafer stage WST to the scanning starting position of the second shot area. When this stepping operation is performed, the main controller 50 measures the positional deviation of the wafer stage WST in directions X, Y, and θz realtime. And, based on the measurement results, the main controller 50 controls the driver 72 so that the XY positional deviation of the wafer stage WST is at a predetermined state, thus controls the position of the wafer stage WST.

In addition, the main controller 50 controls the driver 44 based on the information on deviation in the θz direction of the wafer stage WST, and to compensate for the error in rotational deviation on the wafer W side the reticle stage RST (reticle fine movement stage 208) is rotatably controlled.

And the main controller 50 performs scanning exposure on the second shot, likewise as is described above.

In this manner, scanning exposure of the shot area on the wafer W and stepping operations to expose the next shot area is repeatedly performed, and the pattern of the reticle R is sequentially transferred onto the entire shot area subject to exposure on the wafer W.

Although it is not specifically described above, as is with the recent scanning steppers, while scanning exposure is being performed on each shot area on the wafer W, the main controller 50 performs focus leveling control described earlier based on the measurement values of the focus sensor 121, and exposure is performed in focus with the depth of focus under several hundred nm.

However, in this embodiment, since the main column 14 supporting the projection optical system PL and the wafer stage WST holding the wafer W is supported independently, although there is an advantage of vibration traveling between the main column and the wafer stage WST being suppressed, the main column 14 and the stage supporting bed 16 supporting the wafer stage WST and the wafer stage WST may move independently. This might cause a response delay (time delay) in focus control or in the focus leveling control on the wafer W during exposure.

Therefore, with the exposure apparatus 10 in this embodiment, when the wafer W is to be exposed, along with the focus leveling control on the wafer W via the Z leveling table 88 based on the measurement values of the focus sensor 121, the main controller 50 obtains the positional relationship between the projection optical system PL and the stage supporting bed 16 in directions of three degrees of freedom (Z, θx, and θy), which are the direction of the optical axis AX of the projection optical system PL and in the tilt direction in respect to the plane perpendicular to the optical axis based on the measurement values of the laser interferometer 102. And the main controller 50 feedback controls the vibration isolators 66A to 66C, or the voice coil motor 70, to be more specific, based on the positional relationship obtained, so that the stage supporting bed 16 maintains a fixed positional relationship with the projection optical system PL or the barrel supporting bed 58.

The fixed positional relationship, referred to above, is a positional relationship, for example, when taking into consideration the responsiveness of the Z leveling table 88, the surface of the wafer W is positioned within a range where the pre-exposing dynamic focusing is sufficiently possible and there is no response delay in the focus control. That is, a positional relationship where the surface of the wafer W is positioned in the vicinity of the focal position of the projection optical system PL, so that the focus sensor 121 is capable of detecting the surface of the wafer W at all times.

In other words, with the exposure apparatus 10 in this embodiment, when performing the focus leveling on the wafer W, the vibration isolators 66A to 66C are controlled based on the measurement values of the laser interferometer 102. By this control, a coarse focus leveling adjustment on the stage supporting bed 16 and the Z position of the wafer W on the wafer stage WST via the stage supporting bed 16 is performed, to bring the focus level up to a certain range. And, based on the detection results of the surface state of the wafer W detected by the focus sensor 121, the Z leveling table 88 is controlled to perform a fine focus leveling adjustment, to make the wafer W coincide within the range of the depth of focus of the image plane of the projection optical system PL.

Accordingly, with the exposure apparatus 10, while stepping operations between shot areas are being performed when sequentially exposing shot areas located in the inner portion of the wafer W, since the stage supporting bed 16 and the projection optical system PL or the barrel supporting bed 58 are maintained in the fixed positional relationship, naturally there is no response delay in the focus leveling control. As a matter of course, in the case of exposing what is called an inward shot and an edge shot, pre-exposing dynamic focusing is possible. Edge shot, in this case, refers to a shot area located in the periphery of the wafer W, and inward shot refers to a shot area which illumination area conjugate with the slit shaped illumination area on the reticle R is relatively scanned from the outer side of the wafer W toward the inside of the wafer W.

Furthermore, the positional relationship between the projection optical system PL and the stage supporting bed 16 in directions of three degrees of freedom (Z, θx, and θy), which are the direction of the optical axis AX of the projection optical system PL and in the tilt direction in respect to the plane perpendicular to the optical axis, can be also obtained based on the measurement values of the position sensor 98 and position sensor 94. That is, based on the measurement values of the position sensor 98, the positional relationship between the first position setting supporting bed BP1 and the barrel supporting bed 58 is obtained in directions of six degrees of freedom. And based on the measurement values of the position sensor 94, the positional relationship between the first position setting supporting bed BP1 and the stage supporting bed 16 is obtained in directions of six degrees of freedom. Accordingly, from these results, the main controller 50 may obtain the positional relationship between the barrel supporting bed 58 (projection optical system PL) and the stage supporting bed 16 on exposure.

In either case, with the exposure apparatus 10, the positional relationship between the projection optical system PL (barrel supporting bed 58) and the stage supporting bed 16 in directions of three degrees of freedom (Z, θx, and θy), which are the direction of the optical axis AX of the projection optical system PL and in the tilt direction in respect to the plane perpendicular to the optical axis, can be maintained in a fixed state. And in this state, the shot area on the wafer W (to be more specific, the area conjugate with the slit shaped illumination area of the reticle R) can be made to coincide within the range of the depth of focus of the image plane of the projection optical system PL by using the focus sensor 121 and the Z leveling table 88. In this manner, focus leveling control with high precision becomes possible.

However, with the device rule becoming finer and finer these days, it is becoming difficult to precisely secure the uniformity of the line width of the pattern transferred onto the wafer W with only the focus control of the wafer W during scanning exposure. This is because when the pattern is transferred onto a shot area located in the circumference of the wafer, depending on whether there is an adjacent shot area or not, the line width of the pattern image differs due to the difference of flare effect. To avoid or suppress such inconvenience, it is preferable to perform a dummy exposure on an imaginary shot area further outside the circumference of the wafer.

Therefore, in this embodiment, when the dummy exposure is performed, focus leveling control on the wafer stage WST is performed by obtaining the positional relationship between the projection optical system PL and the stage supporting bed 16 in directions of three degrees of freedom (Z, θx, and θy), which are the direction of the optical axis AX of the projection optical system PL and in the tilt direction in respect to the plane perpendicular to the optical axis based on the measurement values of the laser interferometer 102 referred to earlier, and by controlling the vibration isolators 66A to 66C, and the like. Accordingly, even when dummy exposure is performed, focus control with high precision is possible, and as a consequence, controllability of the line width can also be improved.

In the case of setting a plurality of dummy shots (imaginary shot areas arranged outside the circumference of the wafer W) on a single wafer W, and exposure on each of the dummy shots is to be performed, it is preferable to perform focus leveling of the wafer stage WST each time the dummy shot is exposed. Likewise, in the case of performing exposure on a single wafer W multiple times (on multiple layers) it is preferable to perform focus leveling of the wafer stage WST each time the dummy shot is exposed.

As is described in detail, with the exposure apparatus 10 in this embodiment, the vibration isolators 56A to 56C supporting the main column 14 are mounted on the first position setting supporting bed BP1, and the vibration isolators 66A to 66C supporting the stage supporting bed 16 are mounted independently from the first position setting supporting bed BP1, on the second position setting supporting bed BP2 which is arranged on the floor surface FD. Therefore, the vibration traveling between the first position setting supporting bed BP1 and the second position setting supporting bed BP2 can be almost cutoff. As a consequence, the reaction force caused with the movement (driving) of the wafer stage WST supported on the stage supporting bed 16 does not travel to the first position setting supporting bed BP1, thus the reaction force caused with the movement (driving) of the wafer stage WST is not the cause of vibration of the projection optical system PL supported by the main column 14 mounted on the first position setting supporting bed BP1.

In addition, since the active vibration isolator is employed for the vibration isolator 56A to 56C, and the main controller 50 controls the vibration isolator 56A to 56C based on the measurement values of the position sensor 98 which measures the positional relationship between the first position setting supporting bed BP1 and the main column 14, the main column, and naturally the projection optical system PL supported by the main column 14 can be maintained at a stable position with the first position setting supporting bed BP1 as a datum. Also, the reticle stage RST is arranged on the main column 14, however since the stage employed as the reticle stage RST is based on a counter-weight method, the vibration of the main column 14 caused because of the reaction force due to the movement of the reticle stage RST is extremely small. And this extremely small vibration of the main column 14 can be suppressed or removed by the vibration isolators 56A to 56C supporting the main column 14.

Furthermore, since the active vibration isolator is employed for the vibration isolator 66A to 66C, and the main controller 50 controls the vibration isolator 66A to 66C based on the measurement values of the position sensor 94 which measures the positional relationship between the first position setting supporting bed BP1 and the stage supporting bed 16, the stage supporting bed 16 can be maintained at a stable position with the first position setting supporting bed BP1 as a datum. And the vibration of the stage supporting bed 16 caused by the movement of the wafer stage WST can be suppressed or removed by the vibration isolators 66A to 66C.

Accordingly, with this embodiment, the positional shift of the pattern to be transferred or the image blur caused, due to the vibration of the projection optical system PL can be effectively suppressed, and the exposure accuracy can be improved. In addition, by the various methods devised as described above, vibration and stress affecting each part of the apparatus are reduced, and the positional relationship between each part of the apparatus can be maintained and adjusted with higher precision. This allows the wafer stage WST to increase in speed and size, and provides an advantage of being able to improve the throughput.

Furthermore, in the embodiment above, the case is described where the main controller 50 controls all the vibration isolators, the reticle loader, and the wafer loader. The present invention, however, is not limited to this, and separate controllers may be arranged respectively to control each of these units. Or, several units may be combined into groups, and a multiple of controllers may control these groups.

In addition, in the embodiment above, the case is described where the active vibration isolator is employed for the vibration isolators, however, as a matter of course, the present invention is not limited to this. That is, all of the vibration isolators, one of the vibration isolator, or a plurality of vibration isolators may be a passive vibration isolator.

Also, with the embodiment described above, the case is described where the present invention is applied to a scanning stepper. The present invention, however, can be suitably applied to a reduction projection exposure apparatus based on a step-and-repeat method that transfers the mask pattern onto the substrate with the mask and substrate in a stationary state and sequentially steps the substrate. Or, the present invention can be suitably applied to a proximity exposure apparatus, which does not use a projection optical system and transfers the mask pattern onto the substrate with the mask in close contact with the substrate.

In addition, the present invention is not limited only to an exposure apparatus for manufacturing semiconductor devices, but can also be widely applied to an exposure apparatus for liquid crystal displays which transfers a liquid crystal display device pattern onto a square-shaped glass plate, or an exposure apparatus to manufacture thin-film magnetic heads.

As the illuminating light IL of the exposure apparatus in the present invention, it is not limited to the ArF excimer laser beam, and a g line (436 nm), an i line (365 nm), a KrF excimer laser beam (248 nm), an $F_2$ laser beam (157 nm), or a charged particle beam such as an X-ray or an electron beam can be used. For example, in the case of using an electron beam, as the electron gun, a thermionic emission type such as lanthanum hexaboraide ($LaB_6$) or tantalum (Ta) can be used.

Furthermore, in the case of using an electron beam, a structure with a mask may be employed, or the structure where the pattern is formed on the substrate with the electron beam drawing directly without using a mask may be employed. That is, if the exposure apparatus is an electron beam exposure apparatus which uses an electron optical system serving as an exposing optical system, the present invention is applicable to any of the types, such as the pencil beam method, the variable beam shaping method, the cell projection method, the blanking aperture method, and the EBPS.

In addition, the magnification of the projection optical system PL, is not limited to the reduction system, and may be an equal magnification and a magnifying system. As the projection optical system, in the case of using far ultraviolet light such as an excimer laser, as the glass material, material such as quartz or fluorite which has transmittance to far ultraviolet light is used. And when an $F_2$ laser or an X-ray is used, the optical system is to be a reflection/refraction type or a reflection type (the reticle used is also to b a reflection type). And in the case of using an electron beam, as the optical system, an electron optical system made up of an electron lens and a deflector can be used. As a matter of course, the optical path where the electron beam passes through, is to be in a vacuumed state.

Also, with an exposure apparatus using vacuum ultraviolet light (VUV) which has a wavelength of around 200 nm and under, the reflection/refraction system may be used as the projection optical system. As this reflection/refraction type projection optical system, for example, a reflection/refraction system having a beam splitter and concave mirror as reflection optical elements, which is disclosed in detail in, for example, Japanese Patent Laid Open No. 08-171054 and the corresponding U.S. Pat. No. 5,668,672, Japanese Pat. Laid Open No. 10-20195 and the corresponding U.S. Pat. No. 5,835,275 can be used. Or, a reflection/refraction system having a concave mirror and the like as reflection optical elements without using any beam splitter, which his disclosed in detail in, for example, Japanese Patent Laid Open No. 08-334695 and the corresponding U.S. Pat. No. 5,689,377, Japanese Patent Laid Open No. 10-3039 and the corresponding U.S. Pat. application Ser. No. 873,605 (application date: Jun. 12, 1997). The disclosures cited above are fully incorporated herein by reference.

Alternatively, a reflection/refraction system in which a plurality of refracting optical elements and two mirrors (a concave mirror serving as a main mirror, and a sub-mirror serving as a back-mirror forming a reflection plane on the side opposite to the incident plane of a refracting element or a parallel flat plate), which details are disclosed in, U.S. Pat. Nos. 5,031,976, 5,488,229, and 5,717,518, maybe used. The two mirrors are arranged on an axis, and an intermediate image of the reticle pattern formed by the plurality of refracting optical elements is re-formed on the wafer by the main mirror and the sub-mirror. In this reflection/refraction system, the main mirror and the sub-mirror are arranged in succession to the plurality of refracting optical elements, and the illumination light passes through a part of the main mirror and is reflected on the sub-mirror and then the main mirror. It then proceeds further through a part of the sub-mirror and reaches the wafer. As long as the national laws in designated states or elected states, to which this international application is applied, permit, the disclosures cited above are fully incorporated herein by reference.

Furthermore, as a reflection/refraction type projection optical system a reduction system can be used which projection magnification is ¼ or ⅕, has a circular image field, and is double telecentric on both the object plane side and image plane side. In the case of a scanning exposure apparatus comprising this reflection/refraction type projection optical system, the irradiation area of the illumination light can be in the field of the projection optical system having the optical axis of the projection optical system roughly as the center, and be determined in a rectangular slit shape extending in the direction almost perpendicular to the scanning direction of the reticle or the wafer. With the scanning exposure apparatus comprising such a reflection/refraction type projection optical system, even, for example, in the case of using an $F_2$ laser beam having a wavelength of 157 nm as the illumination light for exposure, a fine pattern of around a 100 nm L/S pattern can be transferred with high precision onto the wafer.

In addition, as the driving system of the wafer stage and the reticle stage, a linear motor which details are disclosed in, U.S. Pat. Nos. 5,623,853 and 5,528,118, may be used. In such a case, either an air levitation type which uses air bearings or a magnetic levitation type which uses the Lorentz force or a reactance force may be used. As long as the national laws in designated states or elected states, to which this international application is applied, permit, the disclosures cited above are fully incorporated herein by reference.

Also, in the case of using a planar motor for the driver of the stage, either one of the magnetic unit or the armature unit can be connected to the stage, and the remaining of the magnetic unit or the armature unit can be arranged on the movement surface side of the stage.

In addition, the stage may be the type which moves along a guide, or it may be a guideless type which does not require any guides.

The reaction force generated with the movement of the reticle stage may be mechanically released to the floor FD (ground) by using a framemember, as is disclosed, for example, in Japanese Patent Laid Open No.08-330224 and the corresponding U.S. Pat. No. 5,874,820. As long as the national laws in designated states or elected states, to which this international application is applied, permit, the disclosures cited above are fully incorporated herein by reference.

The exposure apparatus in the embodiment above can be made by incorporating the illumination optical system made up of a plurality of lenses and the projection optical system into the main body of the exposure apparatus, performing optical adjustment, while incorporating the reticle stage or wafer stage that are made up of various mechanical components into the main body of the exposure apparatus, and connecting the wiring and piping, and furthermore, performing total adjustment (electrical adjustment, operational adjustment). The exposure apparatus is preferably made in a clean room in which temperature, degree of cleanliness, and the like are controlled.

In addition, a semiconductor device is manufactured through the following steps: the step of designing the function and performance of the device; the step of manufacturing a reticle on the basis of the design step; the step of manufacturing a wafer from a silicon material; the step of transferring a reticle pattern onto the wafer by using the exposure apparatus of the above embodiment; the step of assembling the device (including dicing, bonding, and packaging process), the inspection step, and the like.

Following is a detailed description of the device manufacturing method.

<<Device Manufacturing Method>>

A device manufacturing method using the exposure apparatus described above in a lithographic process will be described next.

Figure 8:
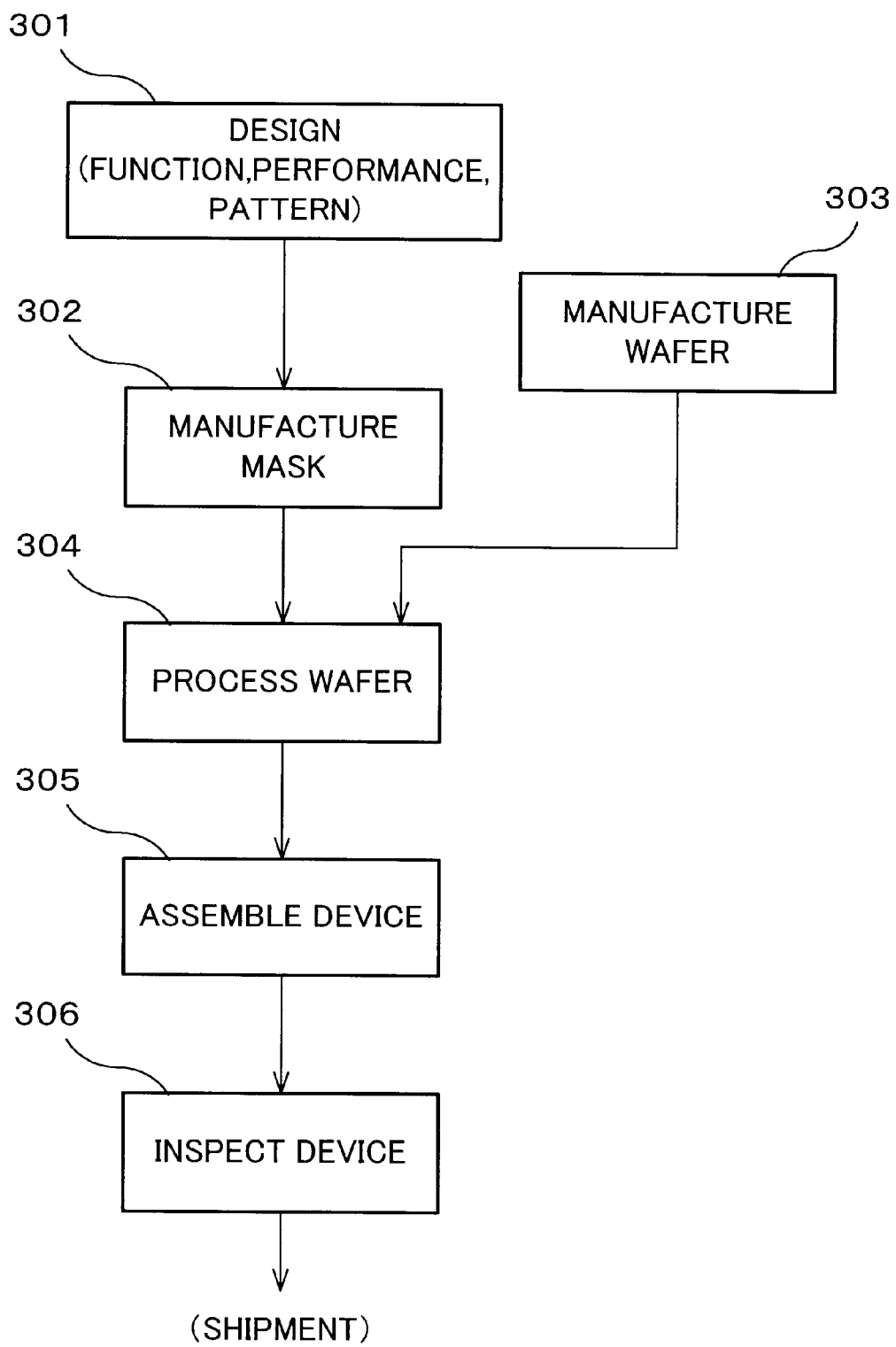
FIG. 8 is a flow chart for explaining an embodiment of a device manufacturing method according to the present invention.

FIG. 8 is a flow chart showing an example of manufacturing a device (a semiconductor chip such as an IC or LSI, a liquid crystal panel, a CCD, a thin magnetic head, a micromachine, or the like). As shown in FIG. 8, in step 301 (design step), function/performance is designed for a device (e.g., circuit design for a semiconductor device) and a pattern to implement the function is designed. In step 302 (mask manufacturing step), a mask on which the designed circuit pattern is formed is manufactured. In step 303 (wafer manufacturing step), a wafer is manufacturing by using a silicon material or the like.

In step 304 (wafer processing step), an actual circuit and the like is formed on the wafer by lithography or the like using the mask and wafer prepared in steps 301 to 303, as will be described later. In step 305 (device assembly step), a device is assembled using the wafer processed in step 304. Step 305 includes processes such as dicing, bonding, and packaging (chip encapsulation).

Finally, in step 306 (inspection step), a test on the operation of the device, durability test, and the like are performed. After these steps, the device is completed and shipped out.

Figure 9:
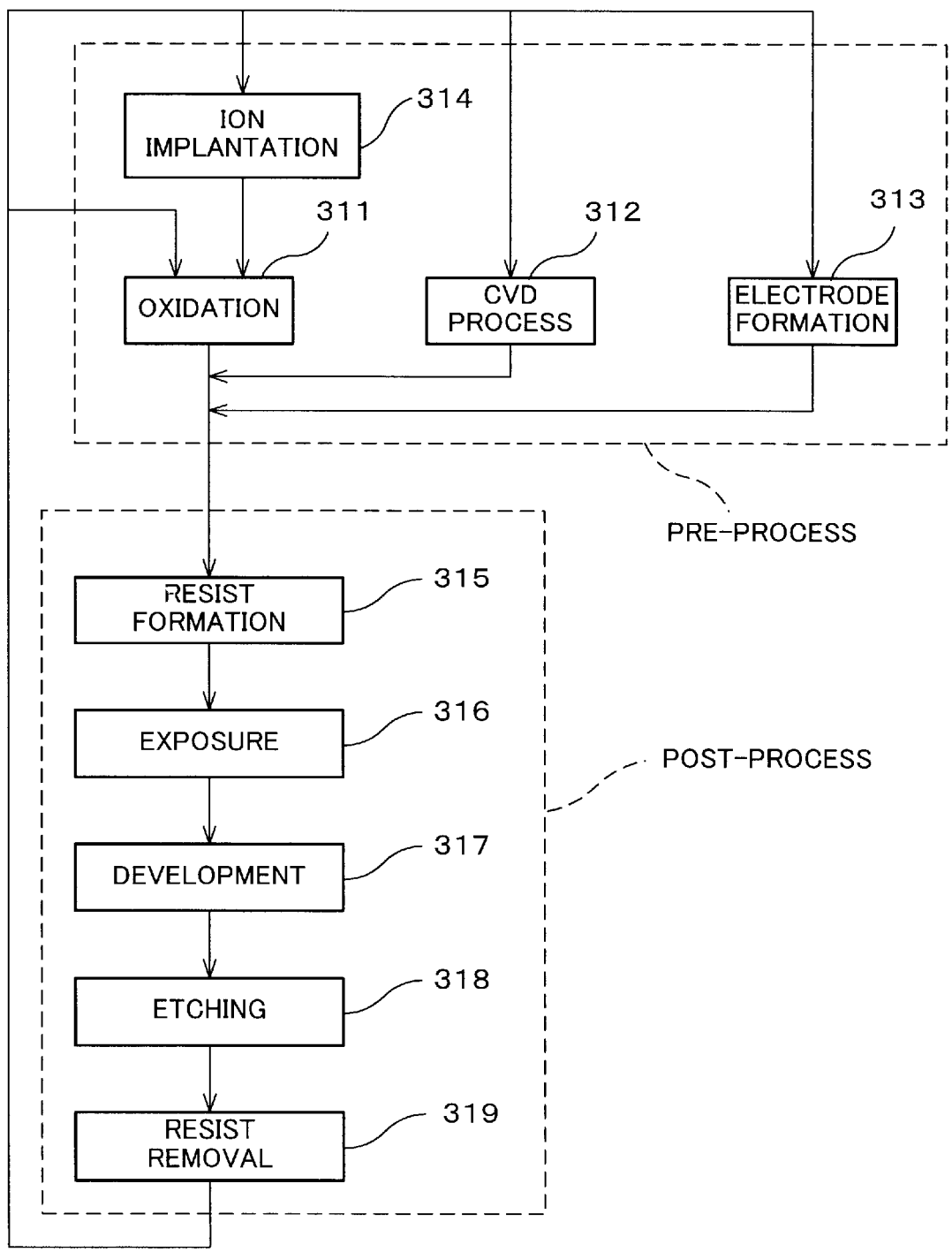
FIG. 9 is a flow chart showing the processing in step 304 in FIG. 8.

FIG. 9 is a flow chart showing a detailed example of step 304 described above in manufacturing the semiconductor device. Referring to FIG. 9, in step 311 (oxidation step), the surface of the wafer is oxidized. In step 312 (CVD step), an insulating film is formed on the wafer surface. In step 313 (electrode formation step), an electrode is formed on the wafer by vapor deposition. In step 314 (ion implantation step), ions are implanted into the wafer. Steps 311 to 314 described above constitute a pre-process for the respective steps in the wafer process and are selectively executed based on the processing required in the respective steps.

When the above pre-process is completed in the respective steps in the wafer process, a post-process is executed as follows. In this post-process, first, in step 315 (resist formation step), the wafer is coated with a photosensitive agent. Next, as in step 316, the circuit pattern on the mask is transcribed onto the wafer by the above exposure apparatus and method. Then, in step 317 (developing step), the exposed wafer is developed. In step 318 (etching step), an exposed member on a portion other than a portion where the resist is left is removed by etching. Finally, in step 319 (resist removing step), the unnecessary resist after the etching is removed.

By repeatedly performing these pre-process and post-process steps, multiple circuit patterns are formed on the wafer.

As described above, according to the device manufacturing method of this embodiment, the exposure apparatus 10 in the embodiment is used in the exposure process (step 316). This makes it possible to improve the exposure accuracy, which in turn leads to producing devices having high integration with high yield.

INDUSTRIAL APPLICABILITY

As is described, the exposure apparatus and the exposure method related to the present invention is suitable to overlay a plurality of layers of a fine pattern onto a substrate such as a wafer in a lithographic process to manufacture micro devices such as an integrated circuit. In addition, the device manufacturing method according to the present invention is suited to manufacture a device having a fine pattern.

What is claimed is:

1. An exposure apparatus that forms a predetermined pattern on a substrate by using an exposing optical system, the exposure apparatus comprising:

a main column that supports the exposing optical system;

a first vibration isolator that supports the main column, the first vibration isolator being an active isolator;

a first base member that supports the first vibration isolator, the first base member being mounted on a floor surface;

a stage supporting member that supports a substrate stage that holds the substrate;

a second vibration isolator that supports the stage supporting member;

a second base member that supports the second vibration isolator, the second base member being mounted on the floor surface and being independent of the first base member;

a column position measurement unit that measures a positional relationship between the first base member and the main column; and a controller that controls the first vibration isolator based on a measurement value of the column position measurement unit.

2. An exposure apparatus according to claim 1, wherein the second vibration isolator is an active vibration isolator.

3. An exposure apparatus according to claim 1, wherein the exposure apparatus further comprises a supporting member that supports the exposing optical system at three points by a V-groove, a conical groove, and a planar surface in respect to the main column.

4. An exposure apparatus according to claim 1, further comprising:

a mask holding member that holds a mask on which the predetermined pattern is formed, and finely drives the mask on a surface of the mask above the main column in directions of three degrees of freedom;

an illumination optical system that illuminates the mask;

an active vibration isolator that supports the illumination optical system;

a six degrees of freedom position measurement unit that measures a positional relationship between the illumination optical system and the main column in directions of six degrees of freedom; and a controller that controls the mask holding member and one of the first vibration isolator and the active vibration isolator holding the illumination optical system, based on a measurement value of the six degrees of freedom position measurement unit.

5. A device that has a predetermined pattern formed, and is manufactured using the exposure apparatus according to claim 1.

6. An exposure apparatus that forms a predetermined pattern on a substrate by using an exposing optical system, the exposure apparatus comprising:

a main column that supports the exposing optical system;

a first vibration isolator that supports the main column;

a first base member that supports the first vibration isolator, the first base member being mounted on a floor surface;

a stage supporting member that supports a substrate stage that holds the substrate;

a second vibration isolator that supports the stage supporting member, the second vibration isolator being an active isolator;

a second base member that supports the second vibration isolator, the second base member being mounted on the floor surface and being independent of the first base member;

a stage supporting member position measurement unit that measures a positional relationship between the first base member and the stage supporting member; and a controller that controls the second vibration isolator based on a measurement value of the stage supporting member position measurement unit.

7. An exposure apparatus according to claim 6, further comprising:

a three degrees of freedom position measurement unit that optically measures a positional relationship between the exposing optical system and one of the stage supporting member and the substrate stage in directions of three degrees of freedom, which are directions of an optical axis of the exposing optical system and a tilt direction in respect to a plane perpendicular to the optical axis; and a controller that controls the second vibration isolator based on a measurement value of the three degrees of freedom position measurement unit.

8. An exposure apparatus according to claim 7, wherein the main column has a supporting member that supports a barrel of the exposing optical system, and the three degrees of freedom position measurement unit comprises:

an interferometer that measures distance between one of the stage supporting member and the substrate stage, and the supporting member at three different points.

9. An exposure apparatus according to claim 8, wherein the interferometer is fixed to the barrel of the exposing optical system.

10. An exposure apparatus according to claim 7, wherein the three degrees of freedom position measurement unit comprises:

an interferometer that measures distance between one of the stage supporting member and the substrate stage, and the exposing optical system at three different points.

11. An exposure apparatus according to claim 6, wherein the exposure apparatus further comprises a supporting member that supports the exposing optical system at three points by a V-groove, a conical groove, and a planar surface in respect to the main column.

12. An exposure apparatus that forms a predetermined pattern on a substrate by using an exposing optical system, the exposure apparatus comprising:

a main column that supports the exposing optical system;

a first vibration isolator that supports the main column;

a first base member that supports the first vibration isolator, the first base member being mounted on a floor surface;

a stage supporting member that supports a substrate stage that holds the substrate;

a second vibration isolator that supports the stage supporting member;

a second base member that supports the second vibration isolator, the second base member being mounted on the floor surface and being independent of the first base member;

a mask holding member that is supported by the main column and holds a mask on which the predetermined pattern projected on the substrate by the exposing optical system is formed, and wherein at least one of a mask carriage system that loads and unloads the mask in respect to the mask holding member and a substrate carriage system that loads and unloads the substrate in respect to the substrate stage is arranged on the first base member; and the exposure apparatus further comprising:

a position measurement system that measures a positional relationship between the first base member and the main column;

an interferometer system that measures a position of at least one of the mask holding member and the substrate stage with one of the exposing optical system and a part of the main column as a datum; and a controller that controls the carriage system arranged on the first base member based on a measurement value of the position measurement system and the interferometer system.

13. An exposure apparatus according to claim 12, wherein the exposure apparatus further comprises an illumination optical system that illuminates the mask, and the illumination optical system is arranged on a third base member that is arranged on the floor surface, the third base member being independent of the first base member and the second base member.

14. An exposure apparatus according to claim 12, wherein the mask is movable in a predetermined direction with predetermined strokes within a surface that is perpendicular to an optical axis of the exposing optical system, and the exposure apparatus further comprises:

a driver that synchronously drives the mask and the substrate stage in the predetermined direction.

15. A device that has a predetermined pattern formed, and is manufactured using the exposure apparatus according to claim 14.

* * * * *